United States Patent
Kang et al.

(10) Patent No.: US 7,212,431 B2
(45) Date of Patent: May 1, 2007

(54) NONVOLATILE FERROELECTRIC MEMORY DEVICE AND CONTROL METHOD THEREOF

(75) Inventors: Hee Bok Kang, Daejeong (KR); Jin Hong Ahn, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/318,630

(22) Filed: Dec. 28, 2005

(65) Prior Publication Data

US 2006/0139987 A1 Jun. 29, 2006

(30) Foreign Application Priority Data

Dec. 29, 2004 (KR) ............. 10-2004-0115397
May 30, 2005 (KR) ............. 10-2005-0045482
Jun. 30, 2005 (KR) ............. 10-2005-0058288

(51) Int. Cl.
*G11C 11/22* (2006.01)

(52) U.S. Cl. ............................. 365/145; 365/65
(58) Field of Classification Search ............ 365/65
See application file for complete search history.

(56) References Cited

U.S. PATENT DOCUMENTS

| | | | | |
|---|---|---|---|---|
| 4,740,922 A | * | 4/1988 | Ogawa | ............ 365/189.04 |
| 5,148,399 A | * | 9/1992 | Cho et al. | ............ 365/205 |
| 5,517,445 A | | 5/1996 | Imai et al. | |
| 5,818,771 A | * | 10/1998 | Yasu et al. | ............ 365/195 |
| 6,151,241 A | | 11/2000 | Hayashi et al. | |
| 6,356,519 B1 | * | 3/2002 | Wakuda et al. | ............ 369/44.28 |
| 6,459,110 B1 | | 10/2002 | Tani | |
| 6,473,329 B1 | | 10/2002 | Nakamura | |
| 6,522,572 B2 | | 2/2003 | Nakamura | |
| 6,617,629 B1 | | 9/2003 | Drab et al. | |
| 6,643,162 B2 | * | 11/2003 | Takeuchi et al. | ............ 365/145 |
| 6,727,536 B2 | | 4/2004 | Hasegawa et al. | |
| 7,126,185 B2 | * | 10/2006 | Kang et al. | ............ 257/316 |
| 2001/0007531 A1 | * | 7/2001 | Kang | ............ 365/145 |
| 2002/0036934 A1 | | 3/2002 | Hasegawa et al. | |
| 2004/0161887 A1 | | 8/2004 | Hasegawa et al. | |
| 2006/0138504 A1 | * | 6/2006 | Kang et al. | ............ 257/295 |
| 2006/0138519 A1 | * | 6/2006 | Kang et al. | ............ 257/314 |
| 2006/0138520 A1 | * | 6/2006 | Kang et al. | ............ 257/314 |
| 2006/0138528 A1 | * | 6/2006 | Kang et al. | ............ 257/321 |
| 2006/0268615 A1 | * | 11/2006 | Kang et al. | ............ 365/185.18 |

FOREIGN PATENT DOCUMENTS

| | | |
|---|---|---|
| JP | 2000285487 | 10/2000 |
| JP | 2002094020 | 3/2002 |

* cited by examiner

*Primary Examiner*—Tan T. Nguyen
(74) *Attorney, Agent, or Firm*—Heller Ehrman LLP

(57) ABSTRACT

A nonvolatile ferroelectric memory device and a control method thereof are provided to control read/write operations of memory cell arrays whose channel resistance is differentiated depending on a polarity state of a ferroelectric material. In the device, data read from a memory cell are sensed and amplified through a sense amplifier, and the amplified data are stored in a register. Then, high data are written in all activated cells. Thereafter, new data applied from a data bus unit to a selected memory cell are written in response to an output signal from a column decoder, and data stored in the register are written-back in an unselected memory cell.

45 Claims, 16 Drawing Sheets

NONVOLATILE FERROELECTRIC MEMORY DEVICE AND CONTROL METHOD THEREOF

BACKGROUND OF THE INVENTION

1. Field of the Invention

The present invention generally relates to a nonvolatile ferroelectric memory device and a control method thereof, and more specifically, to a technology of controlling read/write operations of a nonvolatile ferroelectric memory cell by embodying a memory cell whose channel resistance changes according to a polarity state of a ferroelectric material making up the cell array in a nano scale memory device.

2. Description of the Related Art

Generally, a ferroelectric random access memory (hereinafter, referred to as 'FeRAM') has attracted considerable attention as next generation memory device because it has a data processing speed as fast as a Dynamic Random Access Memory (hereinafter, referred to as 'DRAM') and preserves data even after the power is turned off.

The FeRAM having structures similar to the DRAM includes the capacitors made of a ferroelectric substance, so that it utilizes a high residual polarization characteristic of the ferroelectric substance in which data is not deleted even after an electric field is eliminated.

The technical contents over the above FeRAM are disclosed in the U.S. Pat. No. 6,775,172 by the same inventor of the present invention. Therefore, the basic structure and the operation over the FeRAM are not described herein.

A unit cell of a nonvolatile FeRAM device includes a switching unit and a nonvolatile ferroelectric capacitor. The switching unit performs a switching operation depending on a state of a word line to connect a nonvolatile ferroelectric capacitor to a sub bit line. The nonvolatile ferroelectric capacitor is connected between a plate line and one terminal of the switching unit. Here, the switching unit of the FeRAM is a NMOS transistor whose switching operation is controlled by a gate control signal.

However, in the nonvolatile FeRAM device, as a cell size becomes smaller, the data retaining characteristic of the device is degraded. Consequently, proper operation of the cell becomes increasingly difficult. That is to say, as voltage is applied to an adjacent cell in a read mode of the cell, data is destroyed to generate an interface noise between cells. Additionally, in a write mode of the cell, as a write voltage is applied to an unselected cell, data of unselected cells is destroyed. Consequently, random access of the memory device becomes difficult.

SUMMARY OF THE INVENTION

Various embodiments of the present invention are directed at forming a floating channel layer that includes a N-type drain region, a P-type channel region and a N-type source region between a word line and a bottom word line to improve a data retaining characteristic, thereby improving reliability of a cell.

In addition, various embodiments of the present invention are directed at improving read/write operating methods in the above-described memory cell array to enable a random access operation.

According to one embodiment of the present invention, a nonvolatile ferroelectric memory device comprises a memory cell array, a sense amplifier unit adapted and configured to sense and amplify data applied from the memory cell array and to store the amplified data, a column decoding unit adapted and configured to decode a column selecting signal for selecting a memory cell, and a column switching unit whose switching operation is controlled in response to an output signal from the column decoding unit. The memory cell array comprises a plurality of unit cell arrays arranged in row and column directions each including a plurality of serially connected unit memory cells whose switching operations are controlled depending on a voltage applied to a plurality of word lines and a plurality of bottom word lines. The column switching unit is adapted and configured to selectively connect a data bus to the sense amplifier unit. According to one aspect of the present invention, each of the plurality of unit memory cells which comprises a ferroelectric layer is adapted and configured to read and write data by inducing differing channel resistance to a channel region depending on a polarity state of the ferroelectric layer.

According to one embodiment of the present invention, a method for controlling a nonvolatile ferroelectric memory device comprises: sensing data stored in a memory cell by inducing differing channel resistance to a floating channel layer depending on a polarity state of a ferroelectric layer; amplifying data of all activated memory cells through a sense amplifier to store the amplified data in a register; storing hidden data in the activated memory cells; and writing input data applied through a data bus in a selected memory cell depending on activation of a column selecting signal, and writing-back data stored in the register into an unselected memory cell.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

The present invention will be described in detail with reference to the accompanying drawings. Wherever possible, the same reference numbers will be used throughout the drawings to refer to the same or like part.

Figure 1A:
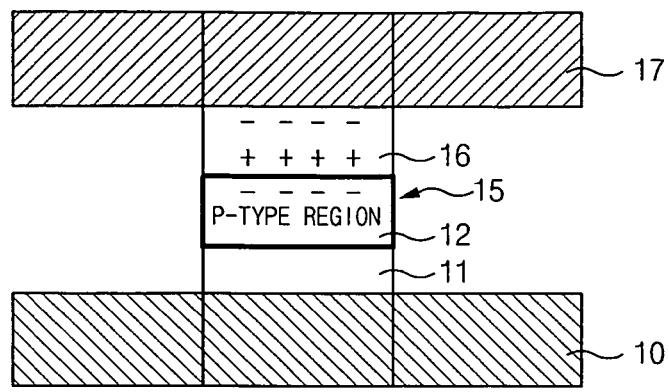
FIGS. 1a to 1c are diagrams illustrating a cross section of a cell and its symbol of a nonvolatile ferroelectric memory device according to an embodiment of the present invention.
Figure 1B:
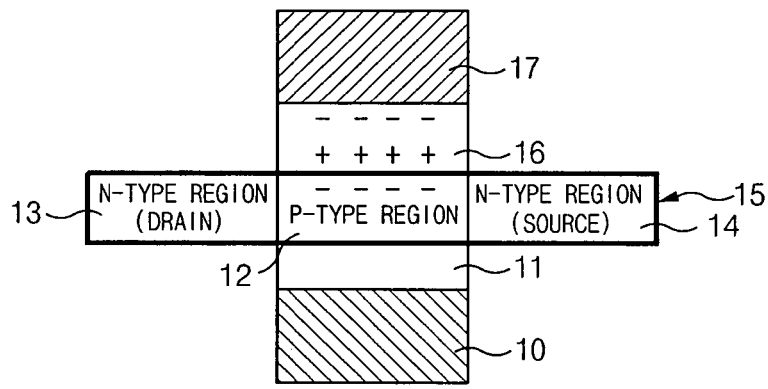
Figure 1C:
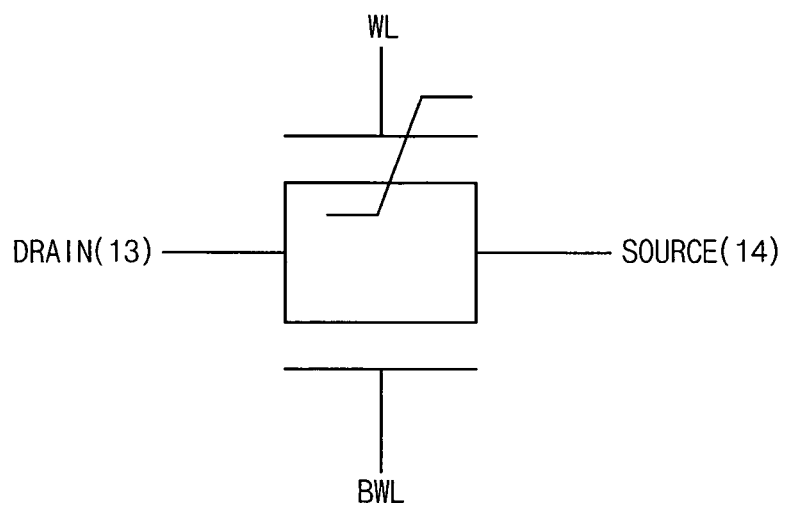

FIGS. 1a to 1c are diagrams illustrating a cross section of a cell and its symbol of a nonvolatile ferroelectric memory device according to an embodiment of the present invention.

FIG. 1a is a cross-sectional diagram illustrating a unit cell in a direction in parallel with a word line.

A bottom word line 10 formed in the bottom layer of the unit cell is arranged in parallel with a word line 17 formed in the top layer of the unit cell. Here, the bottom word line 10 and the word line 17 are selectively driven by the same row address decoder (not shown). An oxide layer 11 is formed over the bottom word line 10, and a floating channel layer 15 comprising a P-type channel region 12 is formed over the oxide layer 11.

A ferroelectric layer 16 is formed over the floating channel layer 15, and the word line 17 is formed over the ferroelectric layer 16.

FIG. 1b is a cross-sectional diagram illustrating a unit cell in a direction perpendicular to the word line.

The oxide layer 11 is formed over the bottom word line 10. The floating channel layer 15 is formed over the insulating layer 11. Here, a drain region 13 and a source region 14 are formed with a N-type, and the channel region 12 is formed with a P-type in the floating channel layer 15, which becomes at a floating state.

For a semiconductor of the floating channel layer 15, materials such as a carbon nano tube, silicon and Ge(Germanium) can be used. The ferroelectric layer 16 is formed over the P-type channel region 12 of the floating channel layer 15, and the word line 17 is formed over the ferroelectric layer 16.

As a result, the nonvolatile ferroelectric memory device according to an embodiment of the present invention reads and writes data by using a channel resistance of the floating channel layer 15 which is differentiated by polarization states of the ferroelectric layer 16. That is, when the polarity of the ferroelectric layer 16 induces positive charges to the channel region 12, the memory cell becomes at a high resistance state, so that the channel is turned off. In contrast, when the polarity of the ferroelectric layer 16 induces negative charges to the channel region 12, the memory cell becomes at a low resistance state, so that the channel is turned on.

The above-described unit memory cell according to the embodiment of the present invention is represented by a symbol shown in FIG. 1c.

Figure 2:
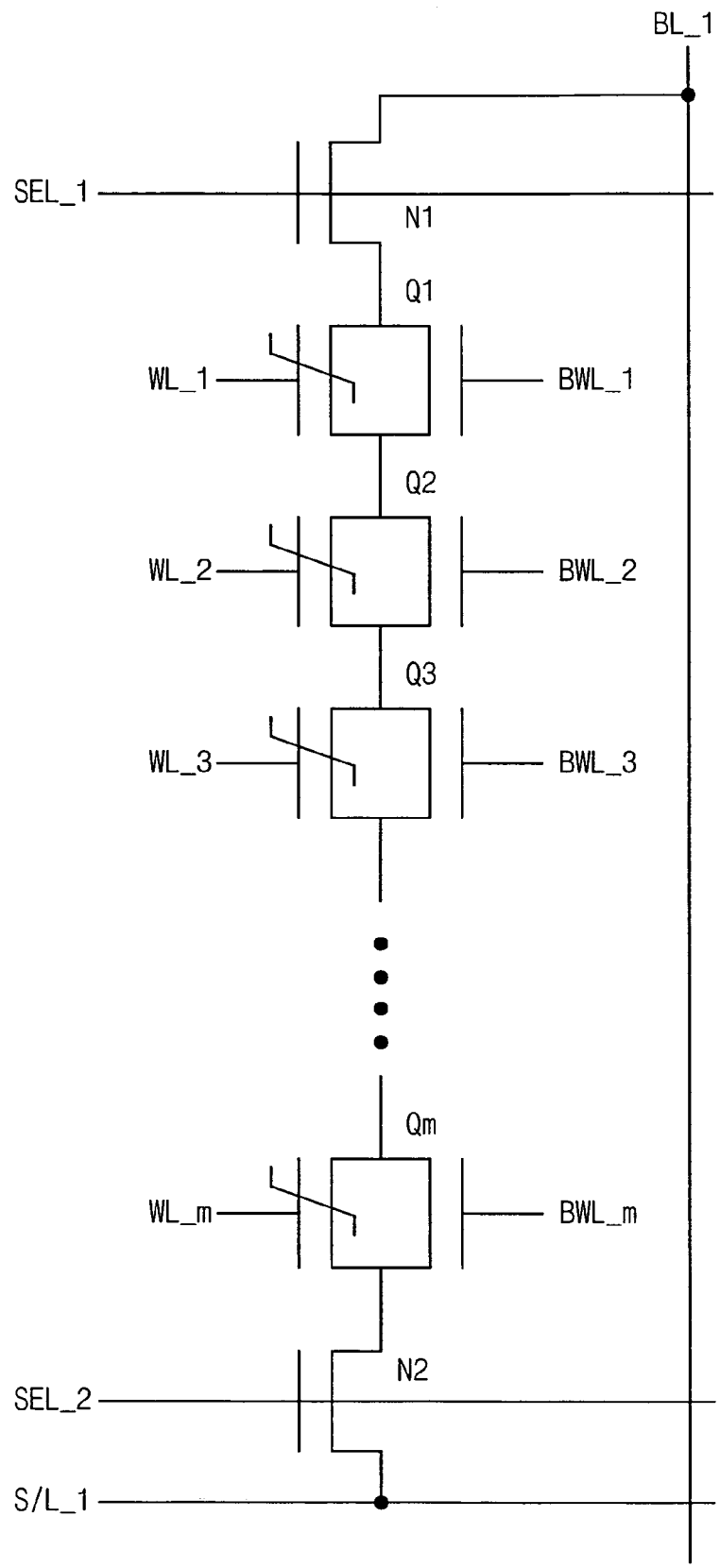
FIG. 2 is a diagram illustrating a unit memory cell array of a nonvolatile ferroelectric memory device according to an embodiment of the present invention.

FIG. 2 is a diagram illustrating a unit memory cell array of a nonvolatile ferroelectric memory device according to an embodiment of the present invention.

In this embodiment, a unit memory cell array includes switching units N1 and N2, and a plurality of memory cells Q1~Qm. Here, the switching unit N1 connected between a bit line BL and the memory cell Q1 has a gate to receive a selecting signal SEL_1. The switching unit N2 connected between a sensing line S/L and the memory cell Qm has a gate to receive a selecting signal SEL_2.

The plurality of memory cells Q1~Qm, which are connected serially between the switching units N1 and N2, selectively perform a switching operation by word lines WL_1~WL_m and bottom word lines BWL_1~BWL_m. The detailed structure of each memory cell Q1~Qm is shown in FIG. 1b. Thus, a source of the memory cell Q1 is connected to the switching unit N1, and a drain of the memory cell Qm is connected to the switching unit N2.

Figure 3:
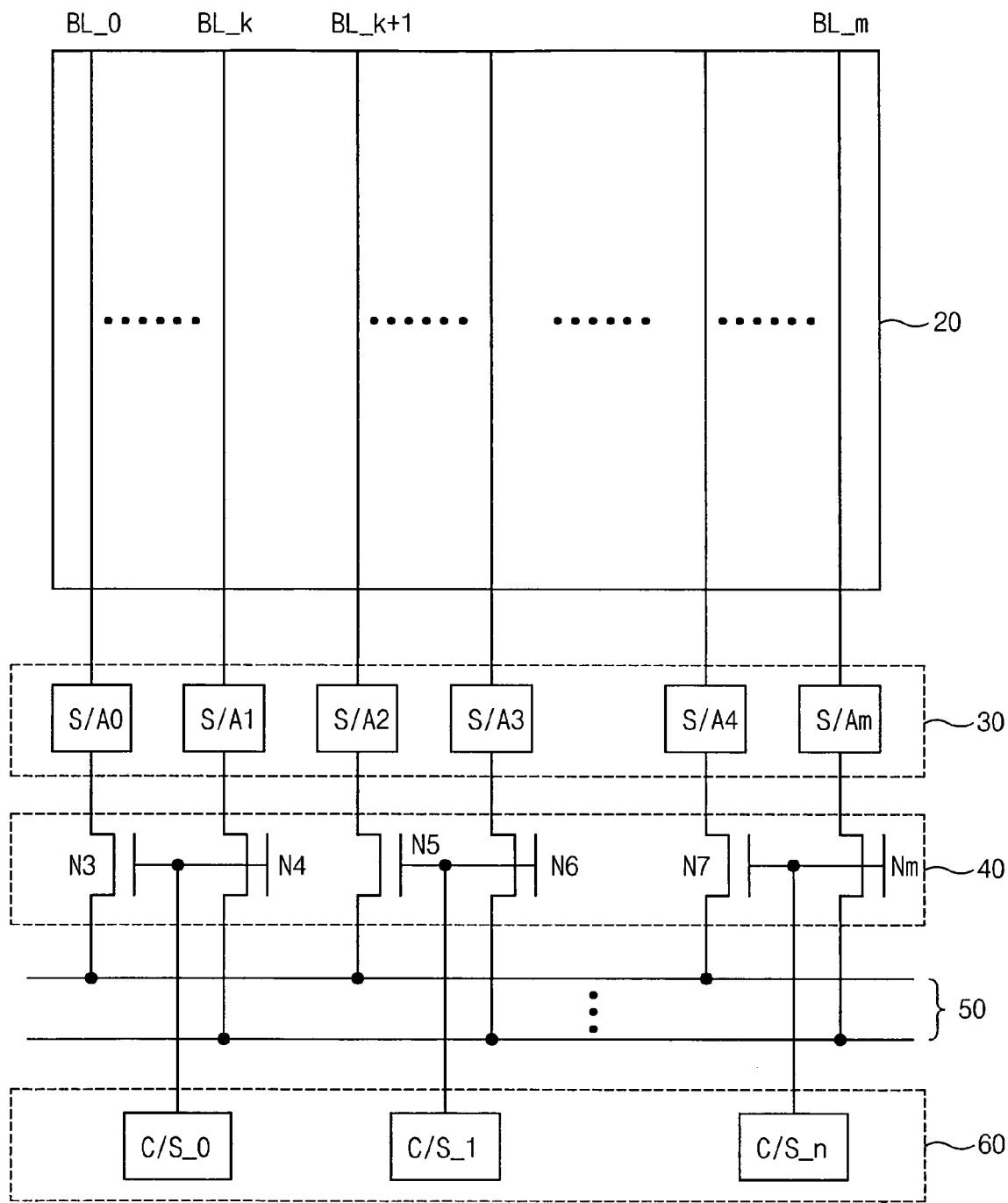
FIG. 3 is a diagram illustrating a nonvolatile ferroelectric memory device according to an embodiment of the present invention.

FIG. 3 is a diagram illustrating a nonvolatile ferroelectric memory device according to an embodiment of the present invention.

In this embodiment, the nonvolatile ferroelectric memory device includes a memory cell array 20, a sense amplifier unit 30, a column switching unit 40, a data bus 50 and a column decoding unit 60.

The memory cell array 20 includes a plurality of the unit memory cell arrays shown in FIG. 2 which are arranged in column and row directions. A plurality of sense amplifiers S/A0~S/Am included in the sense amplifier unit 30 are respectively connected to a plurality of bit lines BL_0~BL_m. Switching operations of a plurality of switching units N3~Nm included in the column switching unit 40 which are connected between the data bus 50 and the plurality of sense amplifiers S/A0~S/Am are selectively controlled by an output signal from the column decoding unit 60.

A plurality of column switches C/S_0~C/S_n included in the column decoding unit 60 which are connected to gates of the plurality of switching units N3~Nm selectively control the switching operations of the plurality of switching units N3~Nm.

Figure 4:
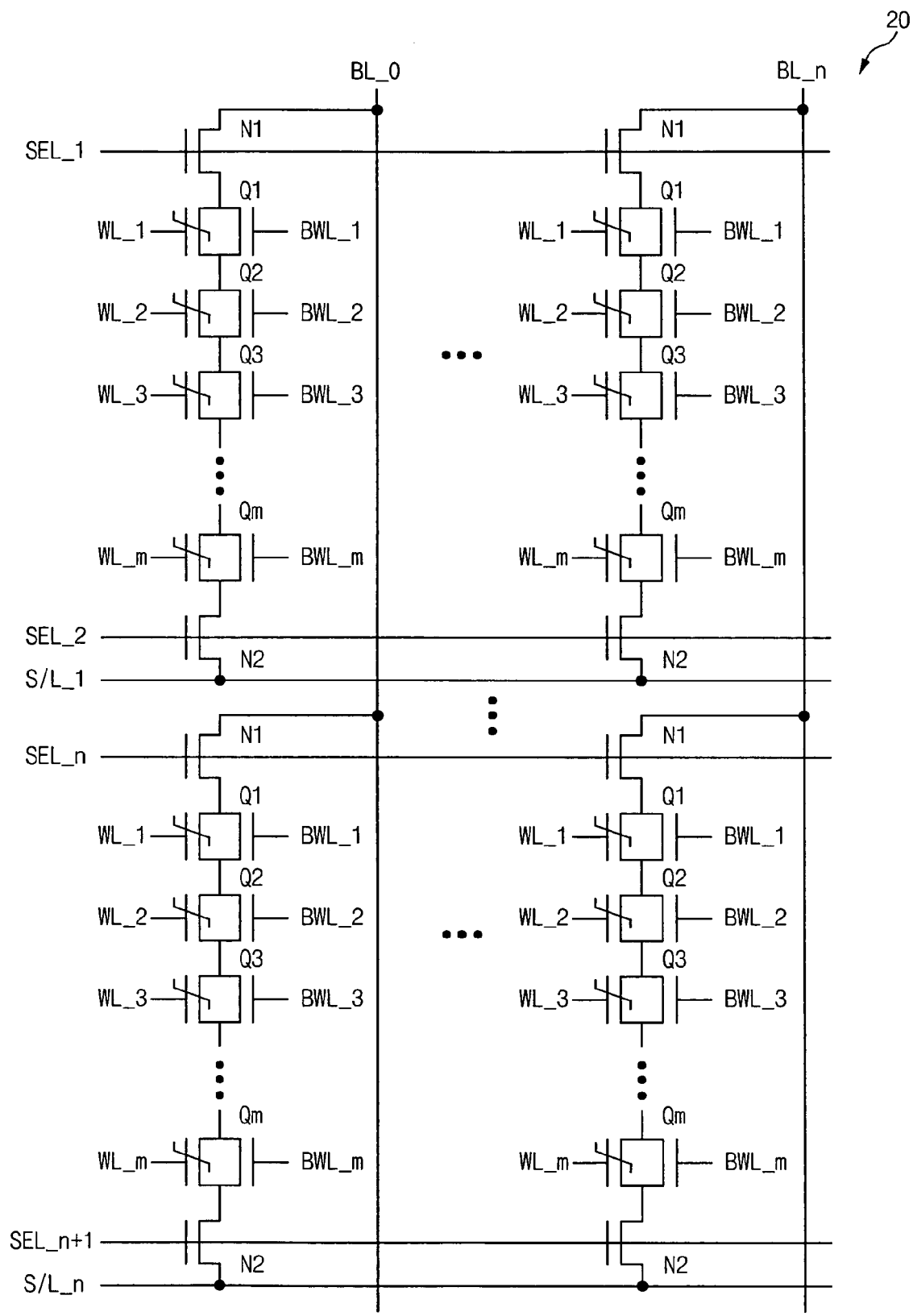
FIG. 4 is a diagram illustrating a memory cell array of a nonvolatile ferroelectric memory device according to an embodiment of the present invention.

FIG. 4 is a diagram illustrating a memory cell array of a nonvolatile ferroelectric memory device according to an embodiment of the present invention.

In this embodiment, a plurality of unit cell arrays 20 are arranged where a plurality of bit lines BL_1~BL_n and a plurality of sensing lines S/L_1~S/L_n are crossed in row and column directions. The structure of each unit cell array 20 is shown in FIG. 2.

Figure 5:
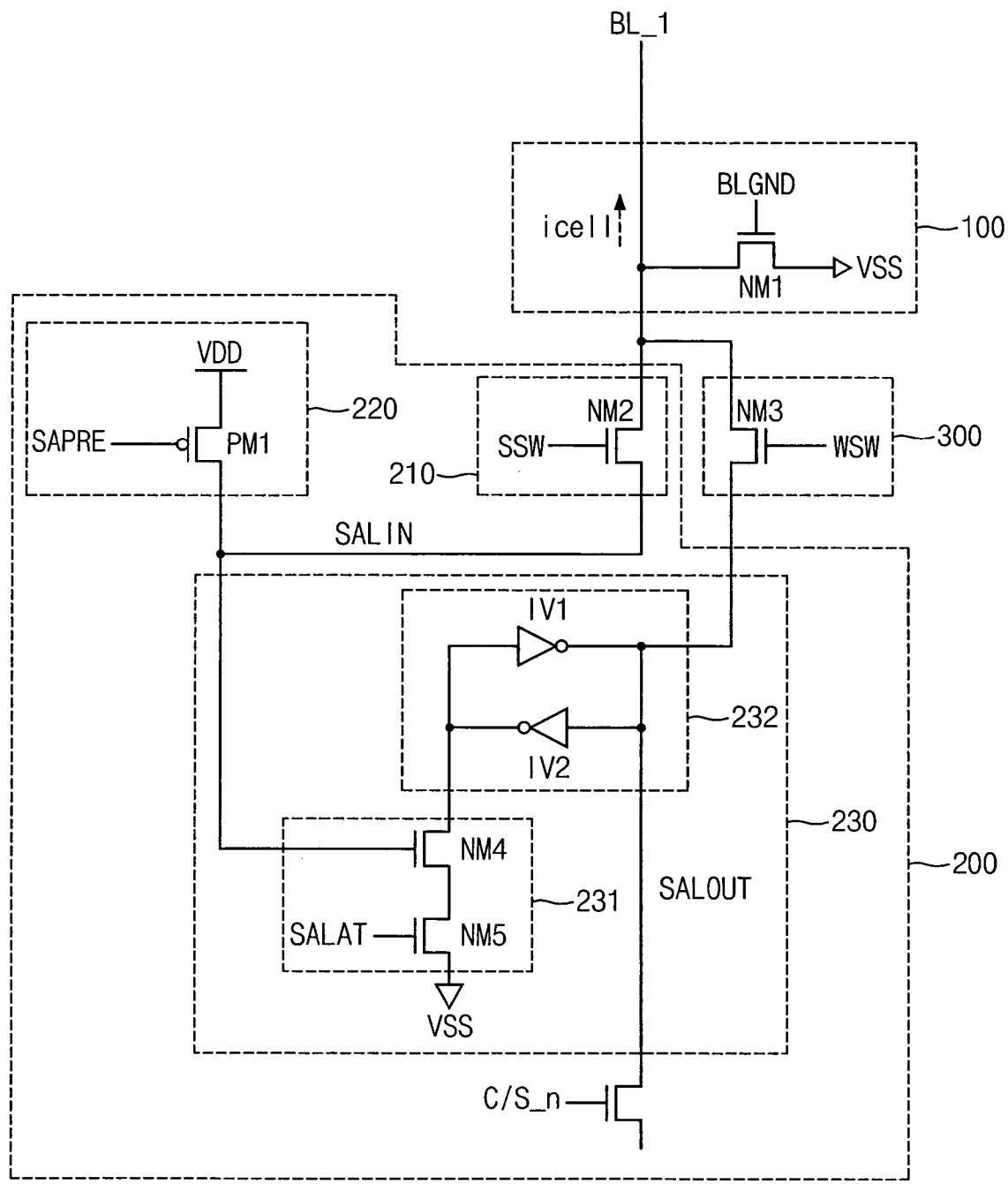
FIG. 5 is a circuit diagram illustrating a first example of a sense amplifier of FIG. 3.

FIG. 5 is a circuit diagram illustrating a first example of the sense amplifier in the sense amplifier unit 30 of FIG. 3.

The sense amplifier of FIG. 5 includes a bit line precharge unit 100, a read control unit 200 and a write control unit 300.

The bit line precharge unit 100 includes a NMOS transistor NM1 which has a source connected to a ground voltage VSS, a drain connected to a bit line BL_1 and a gate to receive a bit line precharge control signal BLGND. That is, the NMOS transistor NM1 precharges the bit line BL_1 to a ground voltage level in response to the bit line precharge control signal BLGND.

The read control unit 200 includes a switching unit 210, a precharge unit 220 and an amplification unit 230. The switching unit 210 includes a NMOS transistor NM2 adapted and configured to apply a signal of the bit line BL_1 to a data latch input node SALIN in response to a sense amplifier switching control signal SSW. The precharge unit 220 includes a PMOS transistor adapted and configured to apply a power voltage VDD level to the data latch input node SALIN in response to a sense amplifier precharge control signal SAPRE.

The amplification unit 230 includes a data latch control unit 231 and a data latch unit 232 so as to amplify and output data on the bit line BL_1.

The data latch control unit 231 includes NMOS transistors NM4 and NM5 which are connected serially between the ground voltage terminal and one terminal of the data latch unit 232. The NMOS transistors NM4 and NM5 apply a ground voltage VSS level to an input terminal of the data latch unit 232 in response to a signal of the data latch input node SALIN and a sense amplifier latch control signal SALAT. The data latch unit 232 includes inverters IV1 and IV2 connected with a latch type where an input terminal of the inverter IV1 is connected to an output terminal of the inverter IV2 whose input terminal is connected to an output terminal of the inverter IV1.

The write control unit 300 includes a NMOS transistor NM3 adapted and configured to apply a voltage of the bit line BL_1 to a sense amplifier output node in response to a write switching control signal WSW in a read mode to precharge the sense amplifier output node SALOUT and to transmit data of the sense amplifier output node SALOUT to the bit line BL_1 in a write mode.

Figure 6A:
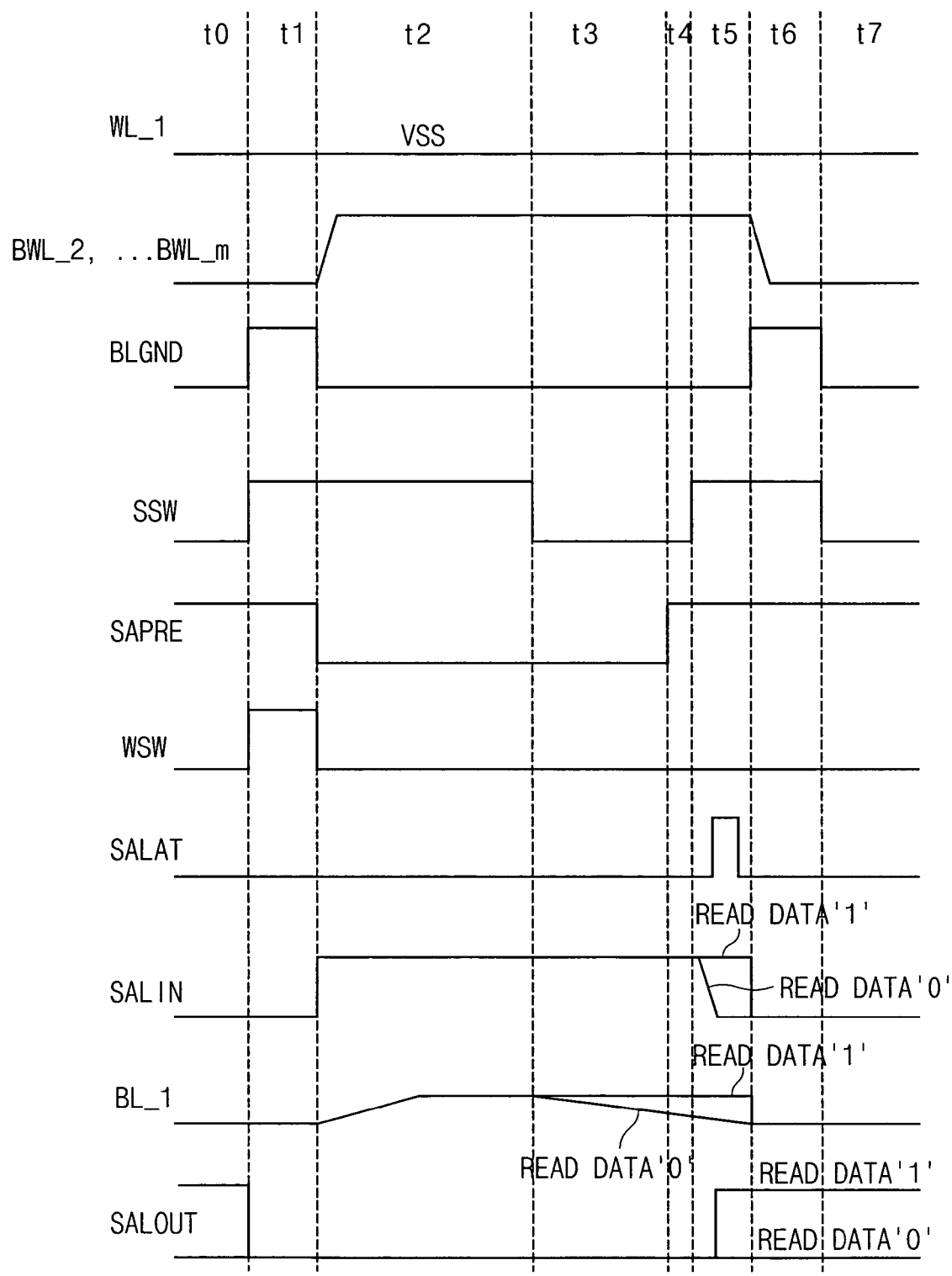
FIG. 6a is a timing diagram illustrating a read operation of the sense amplifier of FIG. 5.

FIG. 6a is a timing diagram illustrating the read operation of the sense amplifier of FIG. 5.

For the read operation, suppose that data stored in a memory cell Q1 of FIG. 2 is read. When the cell Q1 connected to a word line WL_1 of a cell array connected to a random bit line BL_1 is selected, a sensing current icell flows into the bit line BL_1.

Figure 9:
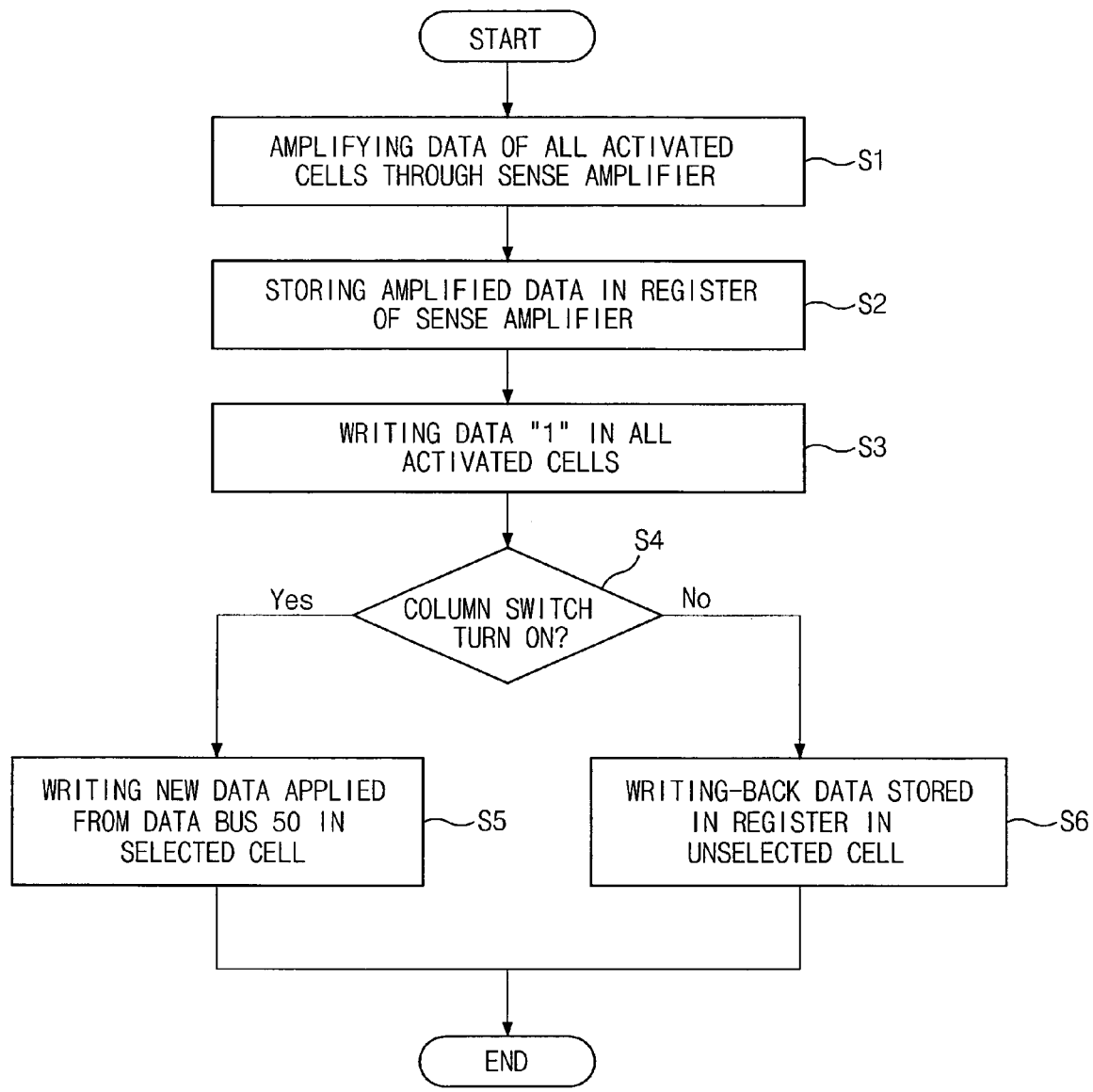
FIG. 9 is a flow chart illustrating a write operation of a method for controlling a nonvolatile ferroelectric memory device according to an embodiment of the present invention.

A period to is defined as a precharge period of the memory cell. In a period t1, when a selecting signal SEL_1 transits into 'high', a switching unit N1 is turned on. As a result, the bit line BL_1 is connected to a source of the memory cell Q1. Here, a selecting signal SEL_2, a plurality of word lines WL_1~WL_m and a plurality of bottom word lines BWL_1~BWL_m are maintained at a low state. The bit line BL_1 and a sensing line S/L_1 are maintained at a low state. The above-described process is shown in FIG. 9 as explanation related to the memory cell array of FIG. 2.

In the sense amplifier of FIG. 5, during the period t1, the bit line precharge control signal BLGND is enabled to a high level, and the bit line BL_1 is precharged to a ground voltage level. Then, the sense amplifier switching control signal SSW is enabled to a high level to turn over the NMOS transistor NM2. As a result, a ground voltage level signal of the bit line BL_1 is applied to the data latch input node SALIN, which is precharged to a ground voltage level. Also, the write switching control signal WSW is enabled to a high level, and the ground voltage level signal of the bit line BL_1 is applied to the sense amplifier output node SALOUT, which is then precharged.

During a period t2, the bottom word lines BWL_2~BWL_m are enabled to a high level, so that the memory cells Q2~Qm are connected to the bit line BL_1 through the bottom word lines BWL_2~BWL_m and the sense amplifier precharge signal SAPRE is enabled to a low level to turn over the PMOS transistor PM1. Thus, a power voltage VDD level is applied to the data latch input node SALIN. As a result, a sensing voltage is set at the bit line BL_1 by a power voltage VDD level through the NMOS transistor NM2. Here, the sensing voltage is a difference of a sense amplifier switching voltage SSW and a threshold voltage Vt of the NMOS transistor NM2.

In a period t3, when the sense amplifier switching control signal SSW is disabled to a low level, the NMOS transistor NM2 is turned off, so that the bit line BL_1 is maintained at a voltage level set in the period t2 depending over the cell sensing current icell or drops to the ground voltage level.

In other words, the cell remains in a turn-on state when the cell data is "0", so that the cell sensing current icell become positive current. The cell remains in a turn-off state when the cell data is "1", so that the cell sensing current icell becomes 0. The cell having the cell data of "0" drops a predetermined voltage level of the bit line BL_1 to the ground voltage level, and the cell having the cell data of "1" maintains a voltage of the bit line BL_1 at a set voltage state.

During a period t4 before the sense amplifier switching control signal SSW is enabled to a high level, the sense amplifier precharge control signal SAPRE is disabled to a high level so as to turn off the PMOS transistor PM1. Then, in a period t5, the sense amplifier switching control signal SSW is enabled to a high level so as to turn over the NMOS transistor NM2.

When the bit line BL_1 is at a setting state, a level of the data latch input node SALIN has no change. However, when the bit line BL_1 is at the ground voltage level, the ground voltage level is applied to the data latch input node SALIN. That is, the bit line BL_1 is at the setting state when the cell data is "1", and the bit line BL_1 is at the ground voltage level when the cell data is "0", so that the data latch input node SALIN becomes at the ground voltage level.

During the period t5, the sense amplifier latch control signal SALAT is enabled to a high level so as to turn over the NMOS transistor NM5. When the cell data is "0", the NMOS transistor NM4 is turned off, so that the ground voltage level is applied to the sense amplifier output node SALOUT. When the cell data is "1", the NMOS transistor NM4 is turned on, so that a high level signal is applied to the sense amplifier output node SALOUT.

Figure 6B:
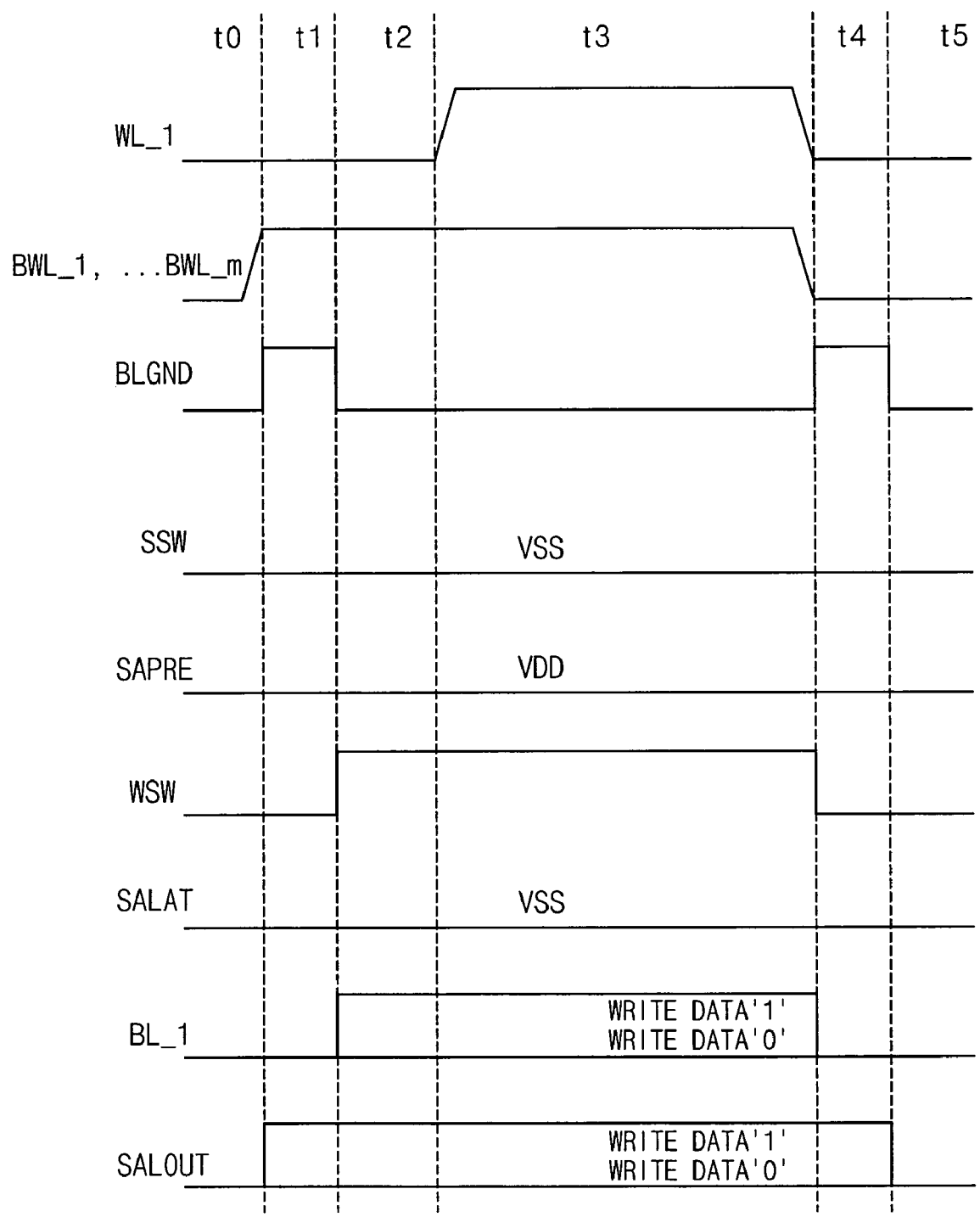
FIG. 6b is a timing diagram illustrating a low data write operation and a high data maintaining operation in the sense amplifier of FIG. 5.

FIG. 6b is a timing diagram illustrating a low data write operation and a high data maintaining operation in the sense amplifier of FIG. 5.

Suppose that the memory cell Q1 of FIG. 2 is selected when the data "0" is written. A period t0 is defined as a precharge period of the memory cell.

In a period t1, when the selecting signal SEL_1 transits to 'high', the switching unit N1 is turned on. As a result, the bit line BL is connected to a source of the memory cell Q1. Here, the selecting signal SEL_2, the plurality of word lines WL_1~WL_m and the plurality of bottom word lines BWL_1~BWL_m are maintained at the low state. The bit line BL_1 and a sensing line S/L_1 are maintained at the low state. The above-described process is shown in FIG. 9 as explanation related to the memory cell array of FIG. 2.

The sense amplifier of FIG. 5 disables the sense amplifier switching control signal SSW constantly to the ground voltage level in the write mode, the sense amplifier latch control signal SALAT to the ground voltage level, and the sense amplifier precharge control signal SAPRE to the power voltage level so as to turn off the NMOS transistors NM2, NM5 and the PMOS transistor PM.

In a period t1, the bit line precharge control signal BLGND is enabled to a high level, so that the bit line BL_1 is precharged to the ground voltage level and all of the bottom word lines BWL_1~BWL_m are enabled to a high level. As a result, all of the memory cells Q1~Qm are connected to the bit line BL_1 through the bottom word lines BWL_1~BWL_m so that data applied to the bit line BL_1 may be transmitted to all of the cells Q1~Qm.

In a period t2, the write switching control signal WSW is enabled to a high level to turn over the NMOS transistor NM3. As a result, data of the sense amplifier output node SALOUT is transmitted into the bit line BL_1.

In a period t3, the word line WL_1 is enabled to a high level so as to write the data of the bit line BL_1 in the cell connected to the word line WL_1. That is, the data "0" is written in the selected cell when the data transmitted to the bit line BL_1 is "0", and the data "1" is maintained in the selected cell when the data transmitted to the bit line BL_1 is "1".

In other words, electrons are accumulated in the P-type channel region 12 of the memory cell Q1 by the word line WL_1. Then, a positive voltage is applied to the word line WL_1 to generate a threshold voltage difference, so that a polarity is formed to induce the electrons to the ferroelectric layer 16. As a result, the data "0" is written in the memory cell Q1. Meanwhile, when the data "1" stored in the memory cell Q1 is required to be maintained as it is, a high voltage is applied to the bit line BL_, so that a voltage of the bit line BL_1 is applied to the memory cell Q1. As a result, the data "1" can be preserved because the electrons are prevented from being formed in the channel region 12.

In a period t4, the word line WL_1, the write switching control signal WSW and all of the bottom word lines BWL_1~BWL_m transits back to the ground voltage level, and the bit line BL_1 is precharged to the ground voltage level by the bit line precharge control signal BLGND, thereby completing the write operation. Then, when the selecting signal SEL_1 of FIG. 2 transits to a low level, the switching unit N1 is turned off.

Figure 7:
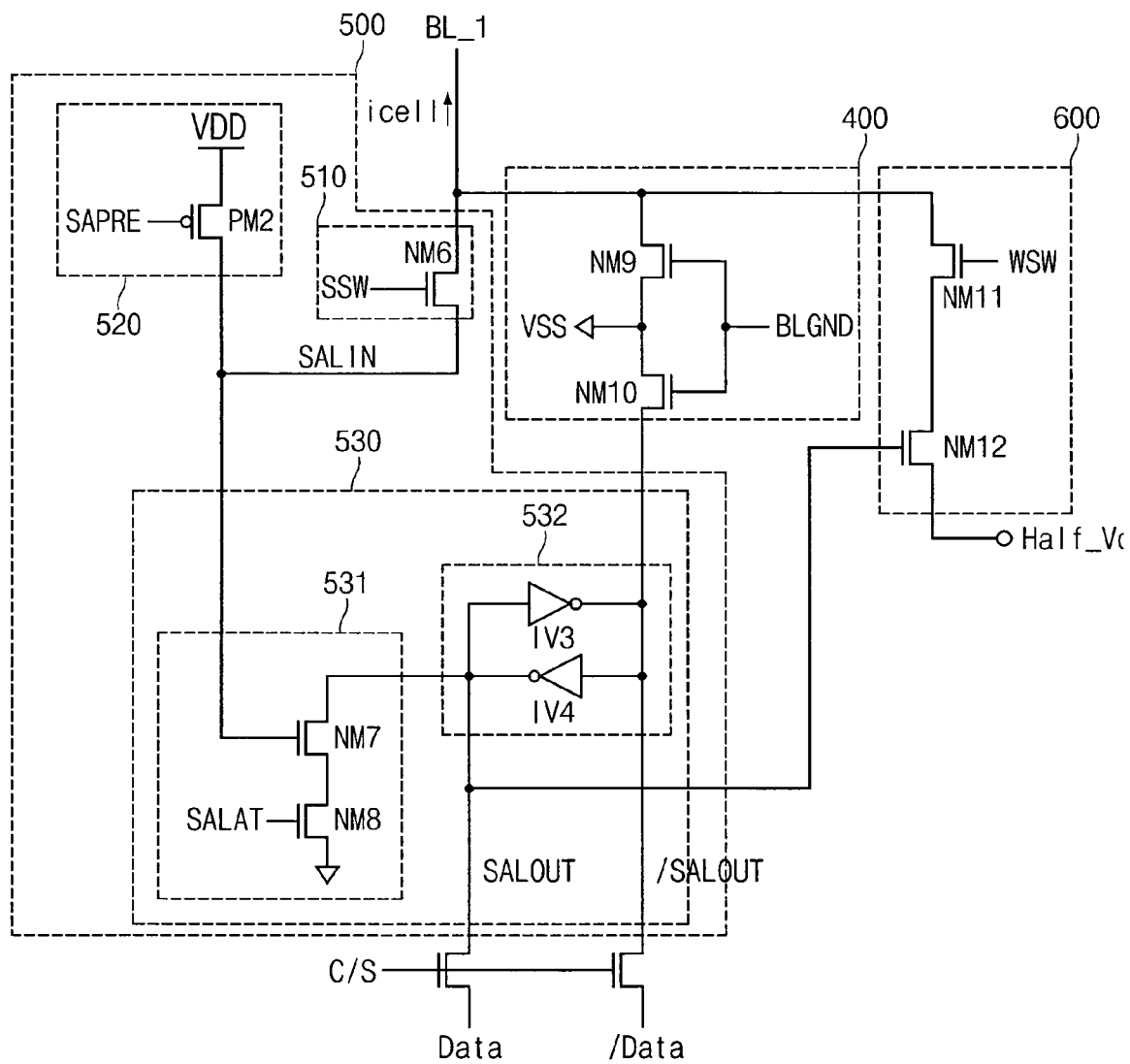
FIG. 7 is a circuit diagram illustrating a second example of the sense amplifier of FIG. 3.

FIG. 7 is a circuit diagram illustrating a second example of the sense amplifier of FIG. 3.

The sense amplifier of FIG. 7 includes a bit line precharge unit 400, a read control unit 500 and a write control unit 600.

The bit line precharge unit 400 includes NMOS transistors NM9 and NM10 for precharging the bit line BL_1 and a sense amplifier bar output node /SALOUT to the ground voltage VSS level, respectively, in response to the precharge control signal BLGND. That is, the NMOS transistors NM9 and NM10 are connected serially between the bit line BL_1 and an output terminal of a data latch unit 532.

The read control unit 500 includes a switching unit 510, a precharge unit 520 and an amplification unit 530. The switching unit 510 includes a NMOS transistor NM6 adapted and configured to apply a signal of the bit line BL_1 to the data latch input node SALIN in response to a sense amplifier switching control signal SSW. The precharge unit 520 includes a PMOS transistor PM2 adapted and configured to apply the power voltage VDD level to the data latch input node SALIN in response to a sense amplifier precharge control signal SAPRE.

The amplification unit 530 includes a data latch control unit 531 and a data latch unit 532 so as to amplify and output data on the bit line BL_1.

The data latch control unit 531 includes NMOS transistors NM7 and NM8 which are connected serially between the ground voltage terminal and an input terminal of the data latch unit 532. The NMOS transistors NM7 and NM8 apply a ground voltage VSS level to the input terminal of the data latch unit 532 in response to a signal of the data latch input node SALIN and a sense amplifier latch control signal SALAT. The data latch unit 532 includes inverters IV3 and IV4 connected with a latch type where an input terminal of the inverter IV1 is connected to an output terminal of the inverter IV2 whose input terminal is connected to an output terminal of the inverter IV1.

The write control unit 600 applies data "0" or "1" to the bit line BL_1 in response to data of the sense amplifier output node SALOUT in the write mode. The write control unit 600 includes a NMOS transistor NM11 controlled by the write switching control signal WSW and a NMOS transistor NM12 controlled by the voltage of the sense amplifier output node SALOUT.

More specifically, when the data "1" is transmitted into the sense amplifier output node SALOUT, the NMOS transistor NM12 is turned on, and the NMOS transistor NM11 is turned on by the write switching control signal WSW to apply a half voltage Half_Vc to the bit line BL_1, so that the data "1" is written.

When the data "0" is written, the NMOS transistor NM11 is turned on by the write control signal WSW, and the data "0" is transmitted into the sense amplifier output node SALOUT. As a result, the NMOS transistor NM12 is turned off, and the bit line BL_1 remains at the ground voltage level, so that the data "0" is written.

Figure 8A:
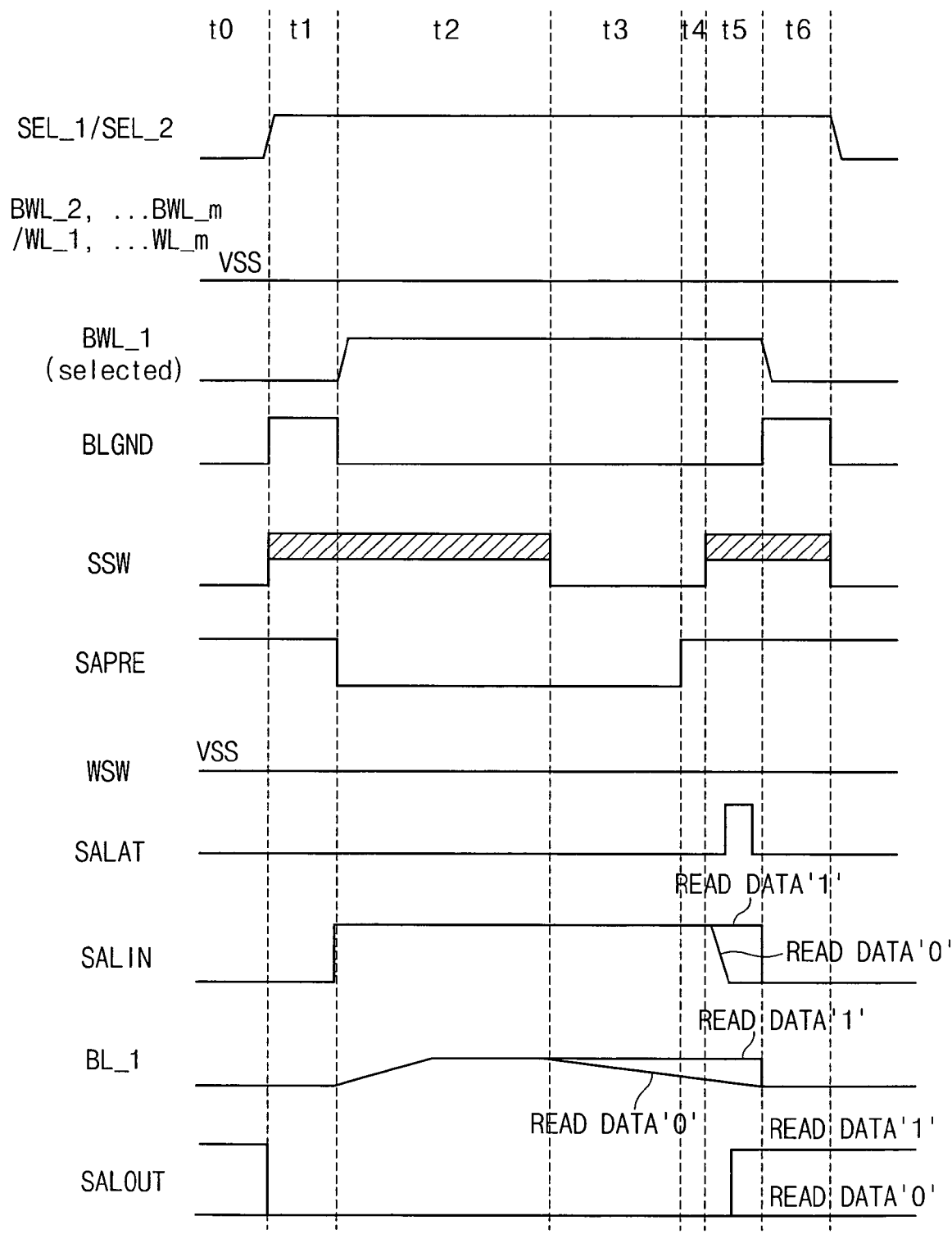
FIG. 8a is a timing diagram illustrating a read operation of the sense amplifier of FIG. 7.

FIG. 8a is a timing diagram illustrating a read operation of the sense amplifier of FIG. 7.

For the read operation, suppose that data stored in a memory cell Q1 of FIG. 2 is read. When the cell Q1 connected to a word line WL_1 of a cell array connected to a random bit line BL_1 is selected, a sensing current icell flows into the bit line BL_1. Here, in the read mode, the write switching control signal WSW is disabled to 'low' so that the NMOS transistor NM11 remains in the turn-off state.

A period t0 is defined as a precharge period of the memory cell. In a period t1, when selecting signals SEL_1 and SEL_2 are enabled to 'high', switching units N1 and N2 are turned on. As a result, the bit line BL_1 is connected to the source of the memory cell Q1, and a sensing line S/L_1 is connected to a drain of the memory cell Qm. Here, a plurality of word lines WL_1~WL_m and a plurality of bottom word lines BWL_1~BWL_m are maintained at a low state. Current flowing between the bit line BL_1 and the sensing line S/L_1 is determined depending on storage polarity of the cell Q1. The above-described process is shown in FIG. 9 as explanation related to the memory cell array of FIG. 2.

In the period t1, the bit line precharge control signal BLGND is enabled to a high level to turn over the NMOS transistors NM9 and NM10, and the bit line BL_1 and the sense amplifier bar output node /SALOUT are precharged to the ground voltage level. Then, the sense amplifier switching control signal SSW is enabled to a high level to turn over the NMOS transistor NM6. As a result, a ground voltage level of the bit line BL_1 is applied to the data latch input node SALIN. Here, the write switching control signal WSW continuously remains in the low level state to turn off the NMOS transistor NM11.

In a period t2, the bottom word line BLW_1 of the selected cell is enabled to 'high', and the sense amplifier precharge signal SAPRE is enabled to a low level to turn over the PMOS transistor PM2. Thus, a power voltage VDD level is applied to the data latch input node SALIN. As a result, a sensing voltage is set in the bit line BL_1 by the power voltage VDD level.

In a period t3, when the sense amplifier switching control signal SSW is disabled to a low level, the NMOS transistor NM6 is turned off, so that the bit line BL_1 is maintained at a voltage level set in the period t2 which depends on either the cell sensing current icell or drops to the ground voltage level.

In other words, the cell remains in the turn-on state when the cell data is "0", so that the cell sensing current icell become positive current. The cell remains in the turn-off state when the cell data is "1", so that the cell sensing current icell becomes "0". The cell having the cell data of "0" drops a predetermined voltage level of the bit line BL_1 to the ground voltage level, and the cell having the cell data of "1" maintains a voltage of the bit line BL_1 at a set voltage state. When a voltage level of the sense amplifier switching control signal SSW is 1.2V, and a threshold voltage of the NMOS transistor NM6 is 0.7V, a voltage applied to the bit line BL_1 is 1.2V−0.7V=0.5V.

Thereafter, the bit line BL_1 is sufficiently developed in the period t3, the sense amplifier precharge control signal SAPRE is disabled to a high level to turn off the PMOS transistor PM2, and the sense amplifier switching control signal SSW is enabled to 'high' to turn over the NMOS transistor NM6. Then, a voltage of the data latch input node SALIN is determined depending on the state of the bit line BL_1. That is, the data latch input node SALIN remains at the high level when the bit line BL_1 is at "1", and discharged to the ground voltage level when the bit line BL_1 is at the ground voltage level.

In a period t5, the sense amplifier latch control signal SALAT is enabled to a high level to turn over the NMOS transistor NM8. When the cell data is "0", the NMOS transistor NM7 is turned off so that the ground voltage level is applied to the sense amplifier output node SALOUT. When the cell data is "1", the NMOS transistor NM4 is turned on so that a high level signal is applied to the sense amplifier output node SALOUT.

In a period t6, the bottom word line BWL_1 is disabled to a low level, and the bit line precharge signal BLGND is enabled to a high level so that the bit line BL_1 is precharged to the ground voltage level.

Figure 8B:
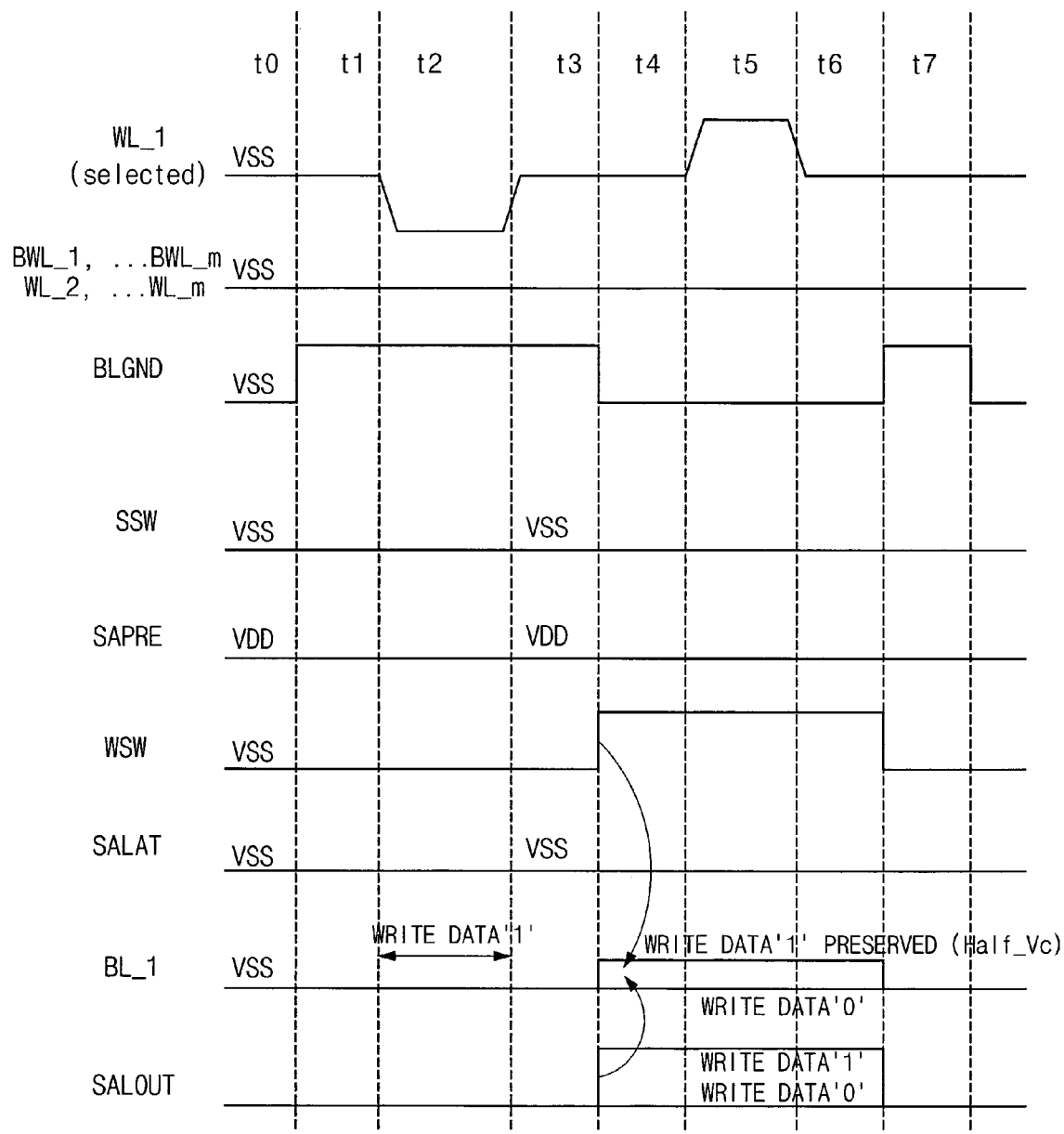
FIG. 8b is a timing diagram illustrating a high data write operation, a high data maintaining operation and a low data write operation in the sense amplifier of FIG. 7.

FIG. 8b is a timing diagram illustrating a high data write operation, a high data maintaining operation and a low data write operation in the sense amplifier of FIG. 7.

Suppose that the memory cell Q1 of FIG. 2 is selected when the data "1" is written. A period to is defined as a precharge period of the memory cell, periods t1 and t2 are defined as a write period of the data "1", periods t3 and t4 are defined as a maintaining period of the data "1", and periods t5 and t6 are defined as a write period of the data "0".

In the period t1, the bit line precharge control signal BLGND is enabled to a high level to turn on the NMOS transistors NM9 and NM10 so that the bit line BL_1 and the sense amplifier bar output node /SALOUT are precharged to the ground voltage level. Here, the plurality of word lines WL_2~WL_m and the plurality of bottom word lines BWL_1~BWL_m remain at the low state, and the sense amplifier switching control signal SSW, the sense amplifier precharge control signal SAPRE and the sense amplifier latch control signal SALAT are disabled to the ground voltage level to turn off the NMOS transistors NM6, NM8 and the PMOS transistor PM2 so that the read control unit 500 is turned off.

In the period t2, a negative voltage VNEG is applied to the word line WL_1, and the data "1" is written in the selected cell Q1. That is, a threshold voltage of a ferroelectric polarization shifting voltage Vc is applied to the word line WL_1. When the voltage of the bit line BL_1 is at the ground voltage level by the NMOS transistor NM9, a threshold voltage Vc is applied between the word line WL_1 and a channel to cause a change in the ferroelectric polarization so that the data "1" is written.

In the period t3, a ground voltage VSS is applied to the word line WL_1 to maintain the written data "1".

In the period t4, the bit line precharge control signal BLGND is disabled to 'low' to turn off the NMOS transistors NM9 and NM10, and the write switching control signal WSW is enabled to 'high' to turn on the NMOS transistor N11 so that data of the sense amplifier output node SALOUT is transmitted to the bit line BL_1. The NMOS transistor NM12 is turned on by the high data of the sense amplifier output node SALOUT to apply the half voltage Half-Vc to the bit line BL_1 which is smaller than the threshold voltage so that the data "1" is preserved.

When the data "1" is transmitted into the sense amplifier output node SALOUT, the NMOS transistor NM12 is turned on to apply the half voltage Half-Vc to the bit line BL_1 so that high data is written in the selected cell. When the data "0" is transmitted into the sense amplifier output node SALOUT, the NMOS transistor NM12 is turned off to apply the ground voltage level to the bit line BL_1 so that low data is written in the cell.

In the period t5, the word line WL_1 is enabled to 'high' so that data of the bit line BL_1 is written in the cell connected to the word line WL_1. That is, the data "0" is written in the selected cell when the data transmitted to the bit line BL_1 is "0", and the data "1" is preserved in the selected cell when the data transmitted to the bit line BL_1 is "1".

Electrons are accumulated in the P-type channel of the memory cell Q1. As a result, a positive voltage is applied to the word line WL_1 to generate a threshold voltage difference so that a polarity is formed to induce channel electrons to a ferroelectric layer. Thereafter, the data "0" is written in the memory cell Q1. When the data "1" stored in the memory cell Q1 is preserved as it is, a high voltage is applied to the bit line BL_1 so that the voltage of the bit line BL_1 is applied to the memory cell Q1. Thus, the data "1" is preserved by preventing electrons from being formed in the channel region.

In the period t6, the word line WL_1, the write switching control signal WSW and all of the bottom word lines BWL_1~BWL_m transit into the ground voltage level again. In the period t7, the bit line precharge control signal BLGND is enabled to the high level again, and the bit line BL_1 is precharged to the ground voltage level to complete the write operation.

The sense amplifier of FIG. 7 applies the threshold voltage of the ferroelectric polarization shifting voltage Vc to the word line WL_1.

When the write data is "1", the bit line BL_1 transits into the half voltage Half_Vc state which is an intermediate value of the threshold voltage of the ferroelectric polarization shifting voltage Vc. Then, the half voltage Half_Vc which is lower than the threshold voltage is applied between the word line WL_1 and the channel. As a result, there is no change in the ferroelectric polarization so that high data is preserved.

When the write data is "0", the bit line BL_1 becomes at the ground voltage level. Then, the threshold voltage Vc between the word line WL_1 and the channel. Thus, a change is generated in the ferroelectric polarization so that low data is written.

FIG. 9 is a flow chart illustrating a write operation of a method for controlling a nonvolatile ferroelectric memory device according to an embodiment of the present invention.

First, data of all activated cells are sensed and amplified through the sense amplifier unit 30 (step S1). The data amplified by the sense amplifier unit 30 is stored in a register in the sense amplifier (step S2). That is, before data "1" is written in all cells, original cell data for a write-back operation is previously stored in the sense amplifier unit 30. Here, the write-back operation means that the original cell data is re-written in the memory cell.

Thereafter, the data "1" is written in the all activated cells (step S3).

Second, cells are divided into those of an activated region and those of an inactivated region in response to an output signal from the column decoding unit 60, and different data are written (step S4).

In other words, a determination is made as to whether the column switches C/S_0~C/S_n are activated. Then, as shown in the write path of FIG. 10, when the corresponding column switch C/S_0 is activated, the switching units N3 and N4 are turned on to output new data applied from the data bus 50 to the sense amplifiers S/A0 and S/A1. As a result, data which are previously stored in the memory cell 20 are destroyed, and new data applied from the data bus 50 are written in the memory cell 20 through the bit line BL_0 and BL_k (step S5).

Figure 10:
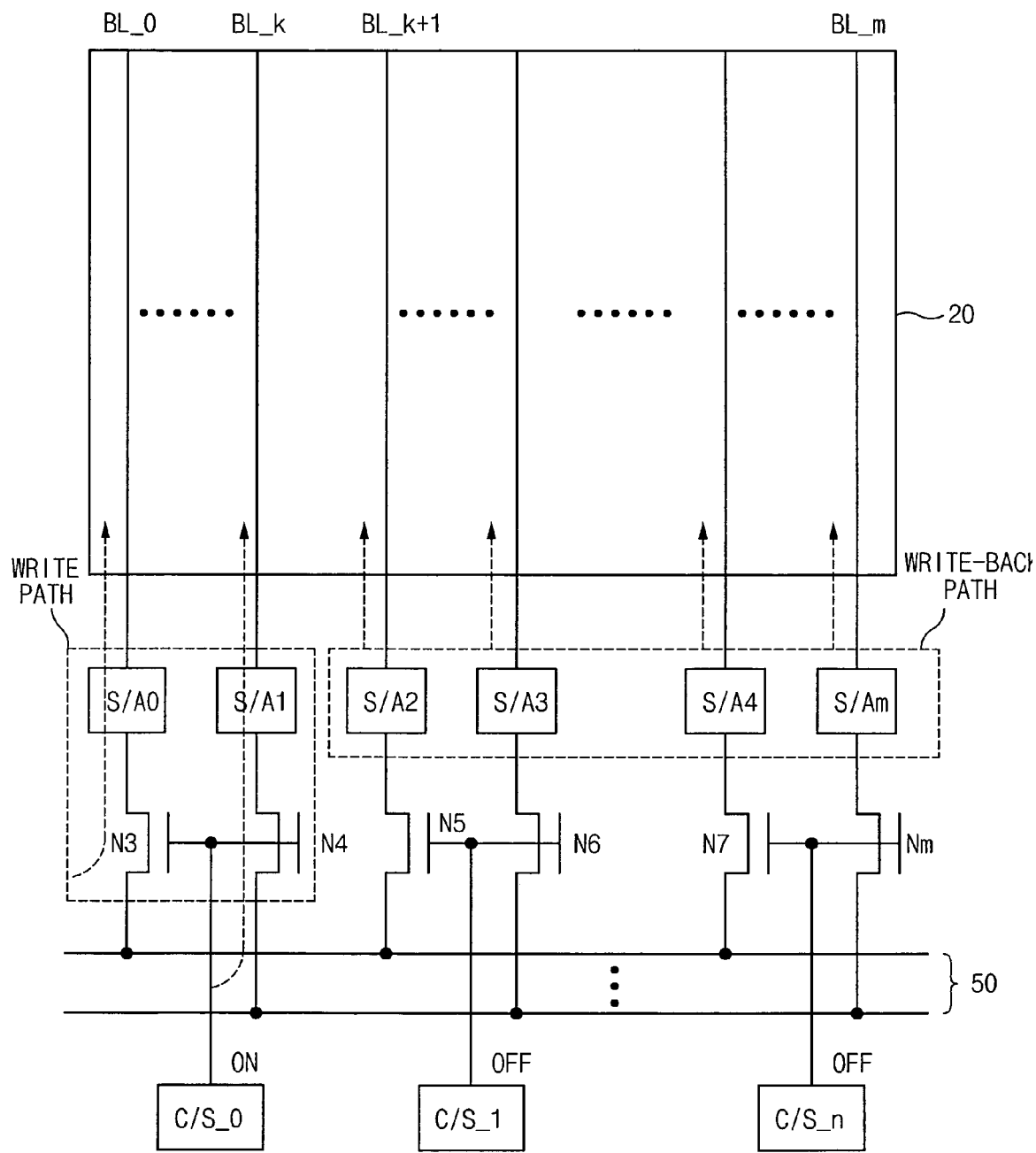
FIG. 10 is a diagram illustrating write and write-back paths of a nonvolatile ferroelectric memory device according to an embodiment of the present invention.

Conversely, as shown in the write-back path of FIG. 10, when corresponding one of the column switches C/S_1~C/S_n is inactivated, the switching units N5~Nm are turned off. As a result, data that was previously stored in the registers of the sense amplifiers S/A2~S/Am is now written-back in the memory cell 20 (step S6).

Figure 11:
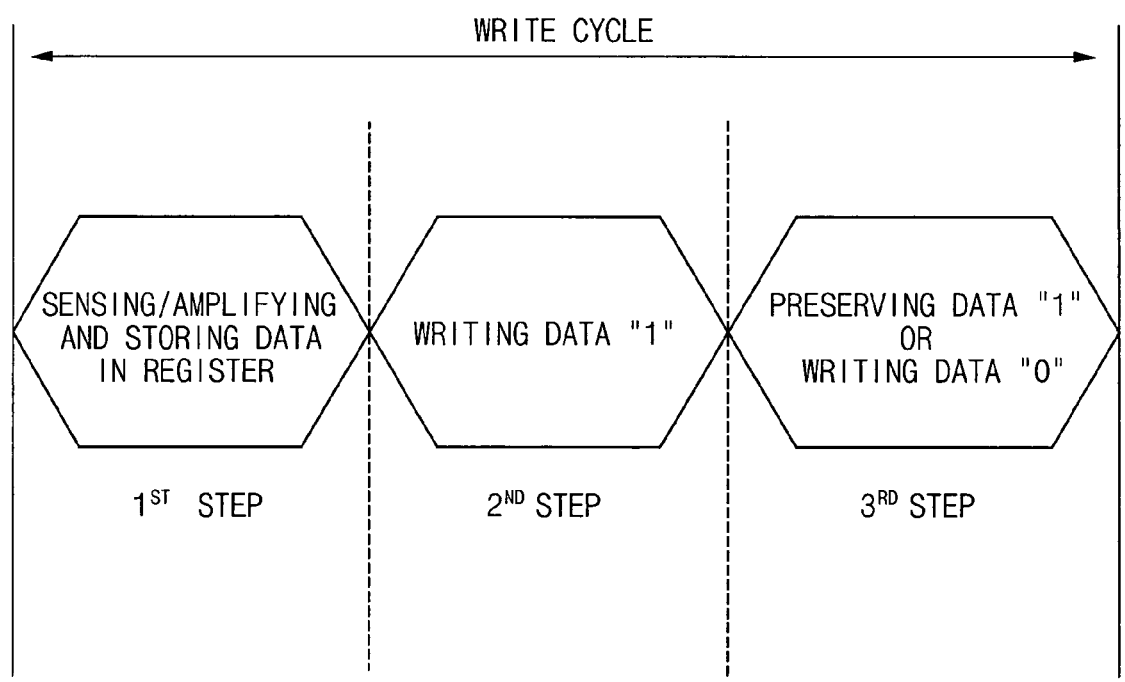
FIG. 11 is a diagram illustrating a write operation step in the method for controlling a nonvolatile ferroelectric memory device according to an embodiment of the present invention.

FIG. 11 is a diagram illustrating a write operation step in the method for controlling a nonvolatile ferroelectric memory device according to an embodiment of the present invention.

In this embodiment, a write operation cycle is divided into three sub operation regions. That is, in the first sub operation region, data of the all activated cells is amplified through the sense amplifier 30, and stored in the register in the sense amplifier.

In the second sub operation region, the data "1" is written in the all activated cells. In the third sub operation region, data "0" is written or the data "1" is preserved. When the data "1" is required to be preserved, a high voltage is applied to the bit line BL in a predetermined period. As a result, a value of the data "1" written in the second sub operation region can be preserved in the memory cell 20.

Figure 12:
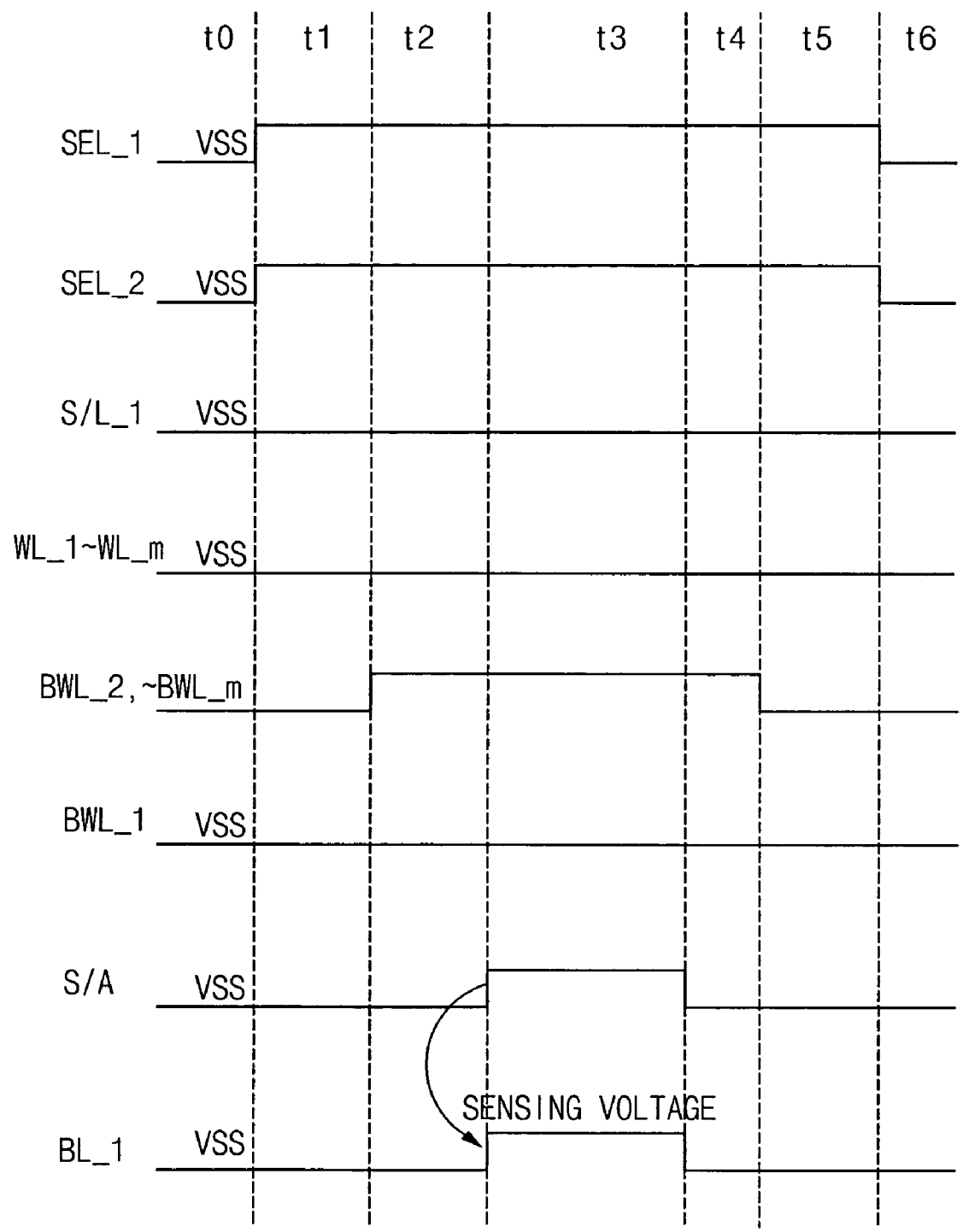
FIG. 12 is a timing diagram illustrating a cell data sensing operation in the method for controlling a nonvolatile ferroelectric memory device.

FIG. 12 is a timing diagram illustrating a cell data sensing operation in the method for controlling a nonvolatile ferroelectric memory device.

Suppose that the memory cell Q1 shown in FIG. 2 is selected when data are sensed. A period t0 is defined as a precharge period of the memory cell.

In a period t1, when the selecting signals SEL_1 and SEL_2 transit to 'high', the switching units N1 and N2 are turned on. As a result, the bit line BL is connected to a source of the memory cell Q1, and the sensing line S/L is connected to a drain of the memory cell Qm.

A plurality of word lines WL_1~WL_m and a plurality of bottom word lines BWL_1~BWL_m are maintained at a low level. Then, the sense amplifier 30, the bit line BL_1 and the sensing line S/L_1 are maintained at a low state.

In a period t2, the rest of the bottom word lines BWL_2~BWL_m except the bottom word line BWL_1 connected to the selected memory cell Q1 transit to 'high'. As a result, the rest of the memory cells Q2~Qm except the selected memory cell Q1 are connected to the sensing line S/L_1.

The plurality of word lines WL_1~WL_m are maintained at a ground level. As a result, the current flowing between the bit line BL_1 and the sensing line S/L is determined by a polarity state formed in the memory cell Q1.

In a period t3, when the sense amplifier 30 is operated to apply a sensing voltage to the bit line BL_1, flowing of current between the bit line BL_1 and the sensing line S/L_1 is determined by a sate of the memory cell Q1.

When a current is not applied from the sense amplifier 30 to the bit line BL_1, it is found that the data "1" is stored in the memory cell Q1. Conversely, when a current greater than a predetermined value is applied from the sense amplifier 30 to the bit line BL_1, it is found that the data "0" is stored in the memory cell Q1.

In a period t4, when the operation of the sense amplifier 30 is stopped, the bit line BL_1 transits to 'low' to complete the sensing operation. In a period t5, the plurality of bottom word lines BWL_2~BWL_m transit to 'low'. In a period t6, when the selecting signals SEL_1 and SEL_2 transit to 'low', the switching units N1 and N2 are turned off.

Figure 13:
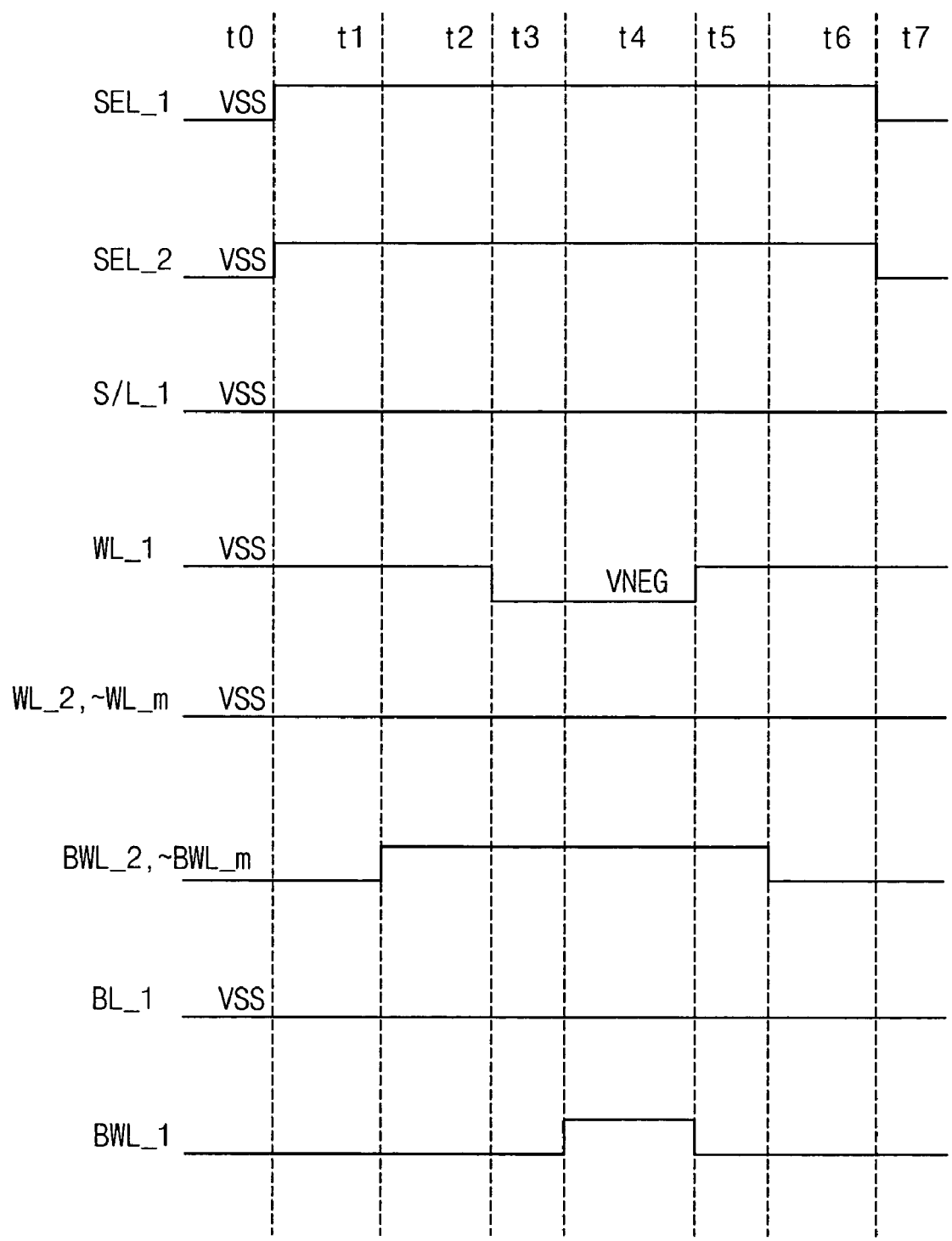
FIG. 13 is a timing diagram illustrating a high data write operation in the method for controlling a nonvolatile ferroelectric memory device.

FIG. 13 is a timing diagram illustrating a high data write operation in the method for controlling a nonvolatile ferroelectric memory device.

Suppose that the memory cell Q1 shown in FIG. 2 is selected when the data "1" is written. A period t0 is defined as a precharge period of the memory cell.

In a period t1, when the selecting signals SEL_1 and SEL_2 transit to 'high', the switching units N1 and N2 are turned on. As a result, the bit line BL is connected to a source of the memory cell Q1, and the sensing line S/L is connected to a drain of the memory cell Qm.

A plurality of word lines WL_1~WL_m and a plurality of bottom word lines BWL_1~BWL_m are maintained at a low level. Then, the bit line BL_1 and the sensing line S/L_1 are maintained at a low state.

In a period t2, the rest of the bottom word lines BWL_2~BWL_m except the bottom word line BWL_1 connected to the selected memory cell Q1 transit to 'high'. As a result, a ground voltage <GND> is applied to a drain and a source of the memory cell Q1.

In a period t3, a negative voltage VNEG is applied to the word line WL_1 connected to the selected memory cell Q1. In a period t4, the bottom word line BWL_1 transits to 'high'. As a result, a high voltage is applied to the ferroelectric layer 16 by voltage division of the word line WL_1 and the bottom word line BWL_1, so that the data "1" is written.

In a period t5, the word line WL_1 and the bottom word line BWL_1 transit to the ground state, again. In a period t6, the rest of the bottom word lines BWL_2~BWL_m transit to the ground state, so that the write operation is completed. Thereafter, in a period t7, when the selecting signals SEL_1 and SEL_2 transit to 'low', the switching units N1 and N2 are turned off.

Figure 14:
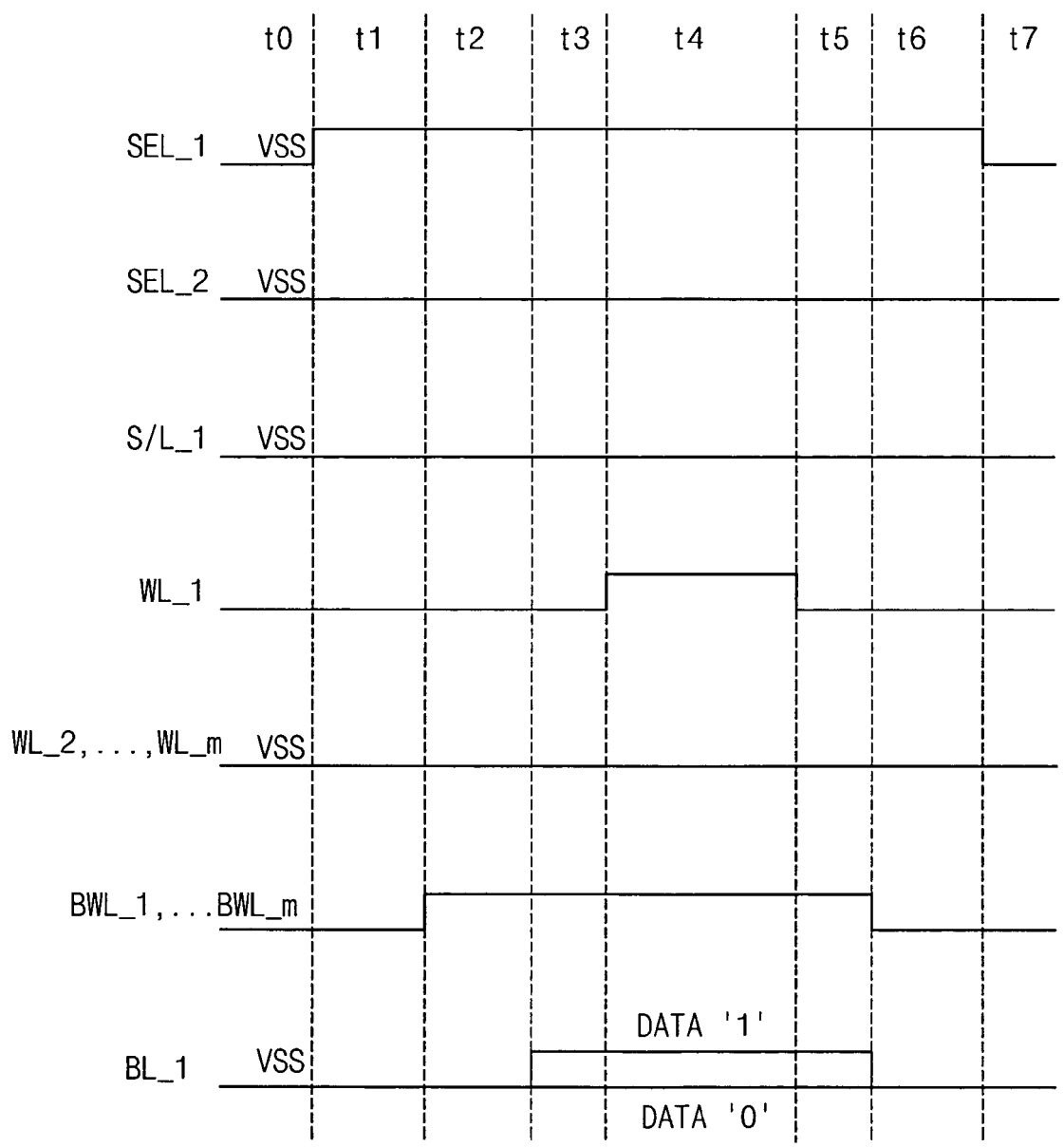
FIG. 14 is a timing diagram illustrating low data write and high data maintaining operations in the method for controlling a nonvolatile ferroelectric memory device.

FIG. 14 is a timing diagram illustrating the write operation of the data "0" and the maintenance operation of the data "1" in the nonvolatile ferroelectric memory device according to an embodiment of the present invention.

Suppose that the memory cell Q1 shown in FIG. 2 is selected when the data "0" is written. A period to is defined as a precharge period of the memory cell.

In a period t1, when the selecting signal SEL_1 transits to 'high', the switching unit N1 is turned on. As a result, the bit line BL is connected to the source of the memory cell Q1.

The selecting signal SEL_2, the plurality of word lines WL_1~WL_m and the plurality of bottom word lines BWL_1~BWL_m are maintained at the low state. The bit line BL_1 and the sensing line S/L_1 are maintained at the low state.

Thereafter, in a period t2, all bottom word lines BWL_1~BWL_m transit to 'high'. As a result, all of the memory cells Q1~Qm are connected to the bit line BL through the bottom word lines BWL_1~BWL_m, so that data applied to the bit line BL can be transmitted to all of the cells Q1~Qm.

In a period t3, when the data to be written in the memory cell Q1 is "0", the bit line BL_1 is continuously maintained at the ground voltage state. Conversely, the bit line BL_1 transits to 'high' when the data "1" stored in the memory cell Q1 is required to be maintained.

In a period t4, the word line WL_1 transits to 'high'. In this case, electrons are accumulated in the P-type channel region 12 of the memory cell Q1 by the word line WL_1. Then, the positive voltage is applied to the word line WL_1, and a threshold voltage difference is generated. Thus, a polarity is formed so that channel electrons may be induced to the ferroelectric layer 16. As a result, the data "0" is written in the memory cell Q1.

When the data "1" stored in the memory cell Q1 is required to be maintained, a high voltage is applied to the bit line BL_1, so that a voltage of the bit line BL_1 is applied to the memory cell Q1. As a result, since the electrons are prevented from being formed in the channel region 12, the data "1" can be preserved.

In a period t5, the word line WL_1 transits to the ground state. In a period t6, all of the bottom word lines BWL_1~BWL_m and the bit line BL_1 transists to the ground state, so the write operation is completed. In a period t7, when the selecting signal SEL_1 transits to 'low', the switching unit N1 is turned off.

Although the floating channel 15 comprising the N-type drain region 13, the P-type channel region 12 and the N-type source region 14 is exemplified here, the present invention is not limited but the floating channel layer 15 can include a P-type drain region, a P-type channel region and a P-type source region.

As described above, in an embodiment of the present invention, data of a cell are not destroyed in a read mode by using a NDRO (Non Destructive Read Out). As a result, the reliability of the cell can be improved at a low voltage of a nano scale ferroelectric cell and a read operation speed can be also improved. Additionally, each of a plurality of ferroelectric unit cell are embodied in an array structure to improve read/write operation methods, thereby enabling a random access operation.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. A nonvolatile ferroelectric memory device comprising:
   a memory cell array comprises a plurality of unit cell arrays arranged in row and column directions each including a plurality of serially connected unit memory cells whose switching operations are selectively dependent upon a voltage applied to a selected one of a plurality of word lines and a selected one of a plurality of bottom word lines;
   a sense amplifier unit adapted and configured to sense and amplify data applied from the memory cell array to store the amplified data;
   a column decoding unit adapted and configured to decode a column selecting signal for selecting a memory cell; and
   a column switching unit whose switching operation is controlled in response to an output signal from the column decoding unit, and adapted and configured to selectively connect a data bus to the sense amplifier unit,
   wherein each of the plurality of unit memory cells comprises a ferroelectric layer and is adapted and configured to read and write data by inducing different channel resistance to a channel region dependent upon a polarity state of the ferroelectric layer.

2. The nonvolatile ferroelectric memory device according to claim 1, wherein an activated unit memory cell of the plurality of unit memory cells is adapted and configured to write data applied from the data bus when the column switching unit is turned on in response to an output signal from the column decoding unit.

3. The nonvolatile ferroelectric memory device according to claim 2, wherein an inactivated unit memory cell of the plurality of unit memory cells is adapted and configured to write back data stored in the sense amplifier unit when the column switching unit is turned off in response to an output signal from the column decoding unit.

4. The nonvolatile ferroelectric memory device according to claim 1, wherein an inactivated unit memory cell of the plurality of unit memory cells is adapted and configured to write back data stored in the sense amplifier unit when the column switching unit is turned off in response to an output signal from the column decoding unit.

5. The nonvolatile ferroelectric memory device according to claim 1, wherein the column switching unit connected between the sense amplifier and the data bus comprises a plurality of NMOS transistors each having a gate connected to the column decoding unit.

6. The nonvolatile ferroelectric memory device according to claim 1, wherein each of the plurality of unit memory cells comprises:
   an insulating layer formed over a bottom word line;
   a floating channel layer comprising a P-type channel region, a N-type drain region, and a N-type source region, wherein the P-type channel region is formed over the insulating layer and remains in a floating state, and wherein the N-type drain region and N-type source region are connected to both sides of the channel region;
   a ferroelectric layer formed over the channel region of the floating channel layer; and
   a word line formed over the ferroelectric layer.

7. The nonvolatile ferroelectric memory device according to claim 6, wherein each of the plurality of unit memory cells further comprises:
   a first switching unit adapted and configured to selectively connect each of the plurality of unit memory cells to a bit line in response to a first selecting signal; and
   a second switching unit adapted and configured to selectively connect each of the plurality of unit memory cells to a sensing line in response to a second selecting signal.

8. The nonvolatile ferroelectric memory device according to claim 7, wherein the first switching unit and the second switching unit remain in a turn-on state when high data are written in the selected one of the plurality of unit memory cells.

9. The nonvolatile ferroelectric memory device according to claim 8, wherein a positive voltage is applied to the selected one of the plurality of bottom word lines, a negative voltage is applied to the selected one of the plurality of word lines and a ground voltage is applied to the bit line and the sensing line of a selected unit memory cell of the plurality of unit memory-cells.

10. The nonvolatile ferroelectric memory device according to claim 7, wherein the first switching unit is turned on and the second switching unit remains in a turn-off state when low data are written in the plurality of memory cells.

11. The nonvolatile ferroelectric memory device according to claim 10, wherein a positive voltage is applied to the selected one of the plurality of bottom word lines and the selected one of a plurality of word lines, and a ground voltage is applied to the bit line and the sensing line of a selected unit memory cell of the plurality of memory cells.

12. The nonvolatile ferroelectric memory device according to claim 7, wherein in a read mode of the plurality of memory cells, a ground voltage is applied to the selected one of the plurality of bottom word lines and the selected one of the plurality of word lines while the first switching unit and the second element are turned on.

13. The nonvolatile ferroelectric memory device according to claim 1, wherein each of the plurality of unit memory cells comprises:
    an insulating layer formed over a bottom word line;
    a floating channel layer comprising a P-type channel region, a P-type drain region, and a P-type source region, wherein the P-type channel region is formed over the insulating layer and remains in a floating state, and wherein the N-type drain region and N-type source region are connected to both sides of the channel region;
    a ferroelectric layer formed over the channel region of the floating channel layer; and
    a word line formed over the ferroelectric layer.

14. The nonvolatile ferroelectric memory device according to claim 13, wherein each of the plurality of unit memory cells further comprises:
    a first switching unit adapted and configured to selectively connect each of the plurality of unit memory cells to a bit line in response to a first selecting signal; and
    a second switching unit adapted and configured to selectively connect each of the plurality of unit memory cells to a sensing line in response to a second selecting signal.

15. The nonvolatile ferroelectric memory device according to claim 14, wherein the first switching unit and the second switching unit remain in a turn-on state when high data are written in the selected one of the plurality of unit memory cells.

16. The nonvolatile ferroelectric memory device according to claim 15, wherein a positive voltage is applied to the selected one of the plurality of bottom word lines, a negative voltage is applied to the selected one of the plurality of word lines and a ground voltage is applied to the bit line and the sensing line of a selected unit memory cell of the plurality of unit memory cells.

17. The nonvolatile ferroelectric memory device according to claim 14, wherein the first switching unit is turned on and the second switching unit remains in a turn-off state when low data are written in the plurality of memory cells.

18. The nonvolatile ferroelectric memory device according to claim 17, wherein a positive voltage is applied to the selected one of the plurality of bottom word lines and the selected one of a plurality of word lines, and a ground voltage is applied to the bit line and the sensing line of a selected unit memory cell of the plurality of memory cells.

19. The nonvolatile ferroelectric memory device according to claim 14, wherein in a read mode of the plurality of memory cells, a ground voltage is applied to the selected one of the plurality of bottom word lines and the selected one of the plurality of word lines while the first switching unit and the second element are turned on.

20. The nonvolatile ferroelectric memory device according to claim 1, wherein each of the plurality of unit memory cells comprises:
    an insulating layer formed over a bottom word line;
    a floating channel layer comprising a N-type channel region, a N-type drain region, and a N-type source region, wherein the P-type channel region is formed over the insulating layer and remains in a floating state, and wherein the N-type drain region and N-type source region are connected to both sides of the channel region;
    a ferroelectric layer formed over the channel region of the floating channel layer; and
    a word line formed over the ferroelectric layer.

21. The nonvolatile ferroelectric memory device according to claim 20, wherein each of the plurality of unit memory cells further comprises:
    a first switching unit adapted and configured to selectively connect each of the plurality of unit memory cells to a bit line in response to a first selecting signal; and
    a second switching unit adapted and configured to selectively connect each of the plurality of unit memory cells to a sensing line in response to a second selecting signal.

22. The nonvolatile ferroelectric memory device according to claim 21, wherein the first switching unit and the second switching unit remain in a turn-on state when high data are written in the selected one of the plurality of unit memory cells.

23. The nonvolatile ferroelectric memory device according to claim 22, wherein a positive voltage is applied to the selected one of the plurality of bottom word lines, a negative voltage is applied to the selected one of the plurality of word lines and a ground voltage is applied to the bit line and the sensing line of a selected unit memory cell of the plurality of unit memory cells.

24. The nonvolatile ferroelectric memory device according to claim 21, wherein the first switching unit is turned on and the second switching unit remains in a turn-off state when low data are written in the plurality of memory cells.

25. The nonvolatile ferroelectric memory device according to claim 24, wherein a positive voltage is applied to the selected one of the plurality of bottom word lines and the selected one of a plurality of word lines, and a ground voltage is applied to the bit line and the sensing line of a selected unit memory cell of the plurality of memory cells.

26. The nonvolatile ferroelectric memory device according to claim 21, wherein in a read mode of the plurality of memory cells, a ground voltage is applied to the selected one of the plurality of bottom word lines and the selected one of the plurality of word lines while the first switching unit and the second element are turned on.

27. The nonvolatile ferroelectric memory device according to claim 1, wherein each of the plurality of unit memory cells comprises:
an insulating layer formed over a bottom word line;
a floating channel layer comprising a N-type channel region, a P-type drain region, and a P-type source region, wherein the P-type channel region is formed over the insulating layer and remains in a floating state, and wherein the N-type drain region and N-type source region are connected to both sides of the channel region;
a ferroelectric layer formed over the channel region of the floating channel layer; and
a word line formed over the ferroelectric layer.

28. The nonvolatile ferroelectric memory device according to claim 27, wherein each of the plurality of unit memory cells further comprises:
a first switching unit adapted and configured to selectively connect each of the plurality of unit memory cells to a bit line in response to a first selecting signal; and
a second switching unit adapted and configured to selectively connect each of the plurality of unit memory cells to a sensing line in response to a second selecting signal.

29. The nonvolatile ferroelectric memory device according to claim 28, wherein the first switching unit and the second switching unit remain in a turn-on state when high data are written in the selected one of the plurality of unit memory cells.

30. The nonvolatile ferroelectric memory device according to claim 29, wherein a positive voltage is applied to the selected one of the plurality of bottom word lines, a negative voltage is applied to the selected one of the plurality of word lines and a ground voltage is applied to the bit line and the sensing line of a selected unit memory cell of the plurality of unit memory cells.

31. The nonvolatile ferroelectric memory device according to claim 28, wherein the first switching unit is turned on and the second switching unit remains in a turn-off state when low data are written in the plurality of memory cells.

32. The nonvolatile ferroelectric memory device according to claim 31, wherein a positive voltage is applied to the selected one of the plurality of bottom word lines and the selected one of a plurality of word lines, and a ground voltage is applied to the bit line and the sensing line of a selected unit memory cell of the plurality of memory cells.

33. The nonvolatile ferroelectric memory device according to claim 28, wherein in a read mode of the plurality of memory cells, a ground voltage is applied to the selected one of the plurality of bottom word lines and the selected one of the plurality of word lines while the first switching unit and the second element are turned on.

34. The nonvolatile ferroelectric memory device according to claim 1, wherein the memory cell array comprises:
a plurality of bit lines arranged in a row direction and connected to the sense amplifier unit;
a plurality of sensing lines arranged perpendicular to the plurality of bit lines; and
the plurality of unit memory cells respectively arranged in row and column directions and located where each of the respective plurality of bit lines and each of the respective plurality of sensing lines cross.

35. The nonvolatile ferroelectric memory device according to claim 1, wherein the sense amplifier array comprises:
a bit line precharge unit adapted and configured to precharge a bit line;
a read control unit adapted and configured to amplify and output data on the bit line in a read mode after the bit line is precharged; and
a write control unit adapted and configured to transmit data inputted from a data bus to the bit line in a write mode after the bit line is precharged.

36. The nonvolatile ferroelectric memory device according to claim 35, wherein the bit line precharge unit comprises a switching unit adapted and configured to apply a ground voltage level to the bit line in response to a bit line precharge control signal.

37. The nonvolatile ferroelectric memory device according to claim 35, wherein the read control unit comprises:
a switching unit adapted and configured to apply data on the bit line to a data latch input node in response to a sense amplifier switching control signal activated in the read mode;
a precharge unit adapted and configured to apply a power voltage level to the data latch input node; and
an amplification unit adapted and configured to amplify and output data on the bit line in response to a signal of the data latch input node.

38. The nonvolatile ferroelectric memory device according to claim 37, wherein the amplification unit comprises:
a data latch unit adapted and configured to latch and amplify data on the bit line; and
a data latch control unit adapted and configured to apply a ground voltage level to an input terminal of the data latch unit in response to a signal of the data latch input node and a latch control signal activated in the read mode.

39. The nonvolatile ferroelectric memory device according to claim 35, wherein the write control unit comprises a switching unit adapted and configured to transmit data inputted from the data bus to the bit line in response to a write switching control signal activated in the write mode.

40. The nonvolatile ferroelectric memory device according to claim 1, wherein the sense amplifier array comprises:
a bit line precharge unit adapted and configured to precharge a bit line and a selected sense amplifier output node;
a read control unit adapted and configured to amplify data on the bit line in a read mode after the bit line and the selected sense amplifier output node are precharged; and
a write control unit adapted and configured to transmit data inputted from a data bus to the bit line in a write mode after the bit line and the one of sense amplifier output nodes are precharged.

41. The nonvolatile ferroelectric memory device according to claim 40, wherein the bit line precharge unit comprises:
a first switching unit adapted and configured to apply a ground voltage level to the bit line in response to a bit line precharge control signal; and
a second switching unit adapted and configured to apply the ground voltage level to the selected sense amplifier output nodes in response to the bit line precharge control signal.

42. The nonvolatile ferroelectric memory device according to claim 40, wherein the read control unit comprises:
a third switching unit adapted and configured to apply data on the bit line to a data latch input node in response to a sense amplifier switching control signal activated in the read mode;
a precharge unit adapted and configured to apply a power voltage level to the data latch input node; and an amplification unit adapted and configured to amplify data on the bit line in response to a signal of the data latch input node.

43. The nonvolatile ferroelectric memory device according to claim 42, wherein the amplification unit comprises:
 a data latch unit having input/output terminals connected to a pair of sense amplifier output nodes, and adapted and configured to latch and amplify data on the bit line; and
 a data latch control unit adapted and configured to apply a ground voltage level to an input terminal of the data latch unit in response to a signal of the data latch input node and a latch control signal activated in the read mode.

44. The nonvolatile ferroelectric memory device according to claim 40, wherein the write control unit comprises:
 a first switching unit adapted and configured to transmit data inputted from the data bus to the bit line in response to a write switching control signal activated in the write mode; and
 a second switching unit adapted and configured to apply a half voltage which is a middle value of a threshold voltage of a ferroelectric polarization shifting voltage to one side of the first switching unit when write data applied from the data bus is "1" or to be turned off when write data is "0", in response to data of the selected sense amplifier output node.

45. A method for controlling a nonvolatile ferroelectric memory device, the method comprising:
 sensing data stored in a memory cell by inducing different channel resistance to a floating channel layer depending on a polarity state of a ferroelectric layer;
 amplifying data of all activated memory cells through a sense amplifier to store the amplified data in a register;
 storing hidden data in the activated memory cells; and
 writing input data applied through a data bus in a selected memory cell depending on activation of a column selecting signal, and writing-back data stored in the register into an unselected memory cell.

* * * * *